United States Patent
Chevalier

(10) Patent No.: US 11,454,880 B2
(45) Date of Patent: *Sep. 27, 2022

(54) METHOD FOR PRODUCING A PLANAR POLYMER STACK

(71) Applicant: ARKEMA FRANCE, Colombes (FR)

(72) Inventor: Xavier Chevalier, Grenoble (FR)

(73) Assignee: ARKEMA FRANCE, Colombes (FR)

( * ) Notice: Subject to any disclaimer, the term of this patent is extended or adjusted under 35 U.S.C. 154(b) by 246 days.

This patent is subject to a terminal disclaimer.

(21) Appl. No.: 16/766,491

(22) PCT Filed: Nov. 23, 2018

(86) PCT No.: PCT/FR2018/052964
§ 371 (c)(1),
(2) Date: May 22, 2020

(87) PCT Pub. No.: WO2019/102160
PCT Pub. Date: May 31, 2019

(65) Prior Publication Data
US 2020/0379339 A1    Dec. 3, 2020

(30) Foreign Application Priority Data
Nov. 24, 2017  (FR) ..................... 1761180

(51) Int. Cl.
G03F 1/48     (2012.01)
C08F 287/00   (2006.01)
G03F 1/80     (2012.01)

(52) U.S. Cl.
CPC .............. *G03F 1/48* (2013.01); *C08F 287/00* (2013.01); *G03F 1/80* (2013.01)

(58) Field of Classification Search
CPC ........ G03F 7/038; G03F 7/2059; G03F 7/095; G03F 1/48; G03F 7/0045; G03F 7/091;
(Continued)

(56) References Cited

U.S. PATENT DOCUMENTS

2013/0280497 A1   2/2013   Willson
2015/0118397 A1   4/2015   Kurosawa et al.
(Continued)

FOREIGN PATENT DOCUMENTS

| | | |
|---|---|---|
| EP | 2216683 A2 | 8/2010 |
| WO | 2016193581 A1 | 12/2016 |
| WO | 2016193582 A1 | 12/2016 |

OTHER PUBLICATIONS

International Search Report issued in PCT/FR2018/052964 dated Mar. 6, 2019 (with translation), 7 pages.
(Continued)

*Primary Examiner* — Vishal V Vasisth
(74) *Attorney, Agent, or Firm* — Pearne & Gordon LLP

(57) ABSTRACT

The invention relates to a method for manufacturing a flat polymeric stack, said stack comprising one or more first and one second layer of (co)polymer (20, 30) stacked one on the other, the first underlying (co)polymer layer (20) not having undergone any prior treatment allowing its crosslinking, at least one of the (co)polymer layers initially being in a liquid or viscous state, said method being characterized in that the upper layer (30), known as the top coat (TC), is deposited on the first layer (20) in the form of a prepolymer composition (pre-TC), comprising one or more monomer(s) and/or dimer(s) and/or oligomer(s) and/or polymer(s) in solution, and in that it is then subjected to a heat treatment capable of causing a crosslinking reaction of the molecular chains within said layer (30, TC).

22 Claims, 4 Drawing Sheets

(58) Field of Classification Search
CPC . G03F 7/11; G03F 7/0955; G03F 1/80; G03F 7/027; G03F 7/0002; C08F 287/00
See application file for complete search history.

(56) References Cited

U.S. PATENT DOCUMENTS

2015/0205207 A1 7/2015 Seshimo et al.
2015/0291832 A1 10/2015 Seshimo et al.

OTHER PUBLICATIONS

Written Opinion issued in PCT/FR2018/052964 dated Mar. 6, 2019, 8 pages.

METHOD FOR PRODUCING A PLANAR POLYMER STACK

This application is a 371 of PCT/FR2018/052964, filed Nov. 23, 2018.

FIELD OF THE INVENTION

The present invention relates to the field of polymeric stacks.

More particularly, the invention relates to a method for controlling the planarity of such stacks. The invention further relates to a method for manufacturing a nanolithography mask using such a stack, the planarity of which is controlled, and a polymeric stack obtained via said planarity control method.

Polymer stacks are used in a multitude of industrial applications, among which mention may be made, in a non-exhaustive manner, of the production of coatings for the aerospace or aeronautical or motor vehicle or wind turbine sector, inks, paints, membranes, biocompatible implants, packaging materials, or optical components, for instance optical filters, or microelectronic, or optoelectronic, or microfluidic components. The invention applies to all the applications, whatever they are, provided that the stack comprises at least two polymer materials stacked one on the other.

Among the various possible industrial applications, the invention also concerns, in a non-exhaustive manner, applications dedicated to the organic electronic field, and more particularly to directed self-assembly, also called DSA (from the English acronym "Directed Self-Assembly") nanolithography applications, for which other requirements need to be concomitantly met.

PRIOR ART

The stability and behavior of polymer thin films on a solid substrate or on an underlying layer, which is itself solid or liquid, are technologically important in some industrial applications, for instance the protection of surfaces, the production of coatings for the aerospace or aeronautical or motor vehicle or wind turbine sector, paints, inks, the manufacture of membranes, or alternatively microelectronic, and optoelectronic, and microfluidic components.

Polymer-based materials have interfaces which are said to be of a low surface energy, where the molecular chains thus have a relatively low cohesion energy, by comparison with other solid interfaces such as the surfaces of metals or oxides with a markedly higher surface energy, which are thus less susceptible to deformation under the effect of any force.

Figure 1A:
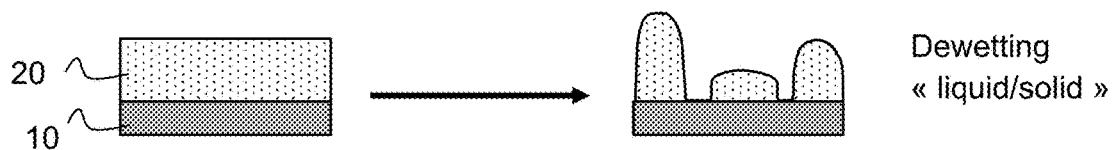
Figure 1B:
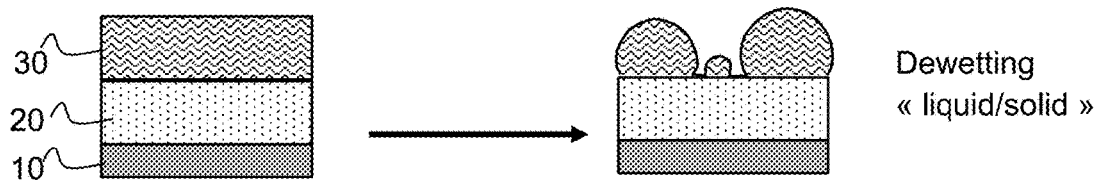

In particular, the dewetting phenomenon of a polymer film deposited in the liquid or viscous state onto the surface of an underlying layer, which is itself in the solid or liquid state, has been known for a long time. By "liquid or viscous polymer" is meant a polymer which has, at a temperature above the glass transition temperature, as a result of its rubbery state, an increased capacity for deformation due to the possibility given to its molecular chains to move freely. Hydrodynamic phenomena which are the cause of dewetting appear as long as the material is not in a solid state, i.e. non-deformable due to the negligible mobility of its molecular chains. This dewetting phenomenon is characterized by the spontaneous removal of the polymer film applied to the surface of the underlying layer when the initial stack is left to evolve freely over time. Loss of continuity of the initial film and a variation in thickness then arise. The film does not spread and forms one or more caps/spherical droplets, giving rise to a non-zero contact angle with the underlying surface. This phenomenon is illustrated in FIGS. 1A to 1O. FIG. 1A more particularly shows a solid substrate 10 onto which is deposited a layer of polymer 20 in the liquid or viscous state. In this first case, the stack system is in a "liquid/solid" configuration. After the deposition of such a polymer layer 20, the dewetting phenomenon occurs and the polymer 20 no longer spreads properly on the surface of the substrate 10, forming spherical caps and resulting in a stack, the surface of which is not flat. FIG. 1B shows a solid substrate 10, onto which is deposited a first layer of polymer 20, this first layer being solidified at the time of the deposition of a second upper layer of polymer 30. In this case, the second layer of polymer 30 on the upper surface is deposited in a liquid or viscous state onto the solid surface of the first layer of polymer 20. It is said that the interface between the two layers of polymer is in a "liquid/solid" configuration. In this case too, after a certain time, a dewetting phenomenon occurs and the polymer 30 does not spread properly on the surface of the first polymer layer 20, forming spherical caps and resulting in a stack, the surface of which is not flat. Finally, FIG. 1O shows a solid substrate 10, onto which is deposited a first layer of polymer 20 in the liquid or viscous state, which is itself covered with a second upper layer of polymer 30 in the liquid or viscous state. In this case, the interface between the two layers of polymer is in a "liquid/liquid" configuration. In this case too, the second upper layer 30 of polymer does not spread properly on the surface of the first polymer layer 20, it may also optionally become partly solubilized in the first polymer layer 20, resulting in an inter-diffusion phenomenon at the interface between the two layers. This layer 30 then deforms, among other things under the combined effect of gravity, of its own density, of its surface energy, of the viscosity ratio between the materials of the polymer layers 30 and 20 that are present, and also under the effect of the Van der Waals interactions leading to the amplification of the capillary waves of the system. This deformation leads to the production of a discontinuous film 30, also including spherical caps, and also deforming the first underlying polymer layer 20. The result is a stack, the surface of which is not flat and the interface between the two layers of polymer of which is not clear.

The coefficient of spreading of a liquid or viscous layer, denoted S, is given by Young's equation below:

$$S = \gamma_C - (\gamma_{CL} + \gamma_L),$$

in which $\gamma_C$ represents the surface energy of the solid or liquid underlying layer, $\gamma_L$ represents the surface energy of the upper layer of a liquid polymer, and $\gamma_{CL}$ represents the energy at the interface between the two layers. By surface energy (denoted $\gamma_x$) of a given material "x" is meant the excess energy at the surface of the material in comparison with that of the material within its bulk. When the material is in the liquid form, its surface energy is equivalent to its surface tension. When the coefficient of spreading S is positive, then the wetting is total and the liquid film spreads completely over the surface of the underlying layer. When the coefficient of spreading S is negative, then the wetting is partial, i.e. the film does not spread completely on the surface of the underlying layer and a dewetting phenomenon takes place if the initial stack system is left to evolve freely.

In these systems of stacks of layer(s) of polymer materials, in which the configurations may be, for example, "liquid/solid" or "liquid/liquid", the surface energies of the various layers may be very different, thus making the entire system metastable or even unstable due to the mathematical formulation of the spreading parameter S.

When a stack system, deposited on any substrate, comprises different layers of polymer material in the liquid/viscous state, stacked on top of each other, the stability of the entire system is governed by the stability of each layer at the interface with different materials.

For this type of metastable, or even unstable, liquid/liquid system, dewetting phenomena have been observed during the relaxation of the initial constraints, this being independent of the nature of the materials involved (small molecules, oligomers, polymers). Various studies (F. Brochart-Wyart et al., *Langmuir,* 1993, 9, 3682-3690; C. Wang et al., *Langmuir,* 2001, 17, 6269-6274; M. Geoghegan et al., *Prog. Polym. Sci.,* 2003, 28, 261-302) have demonstrated and explained theoretically and experimentally the behavior and also the origin of the dewetting observed. Irrespective of the mechanisms (spinodal decomposition or nucleation/growth), this type of liquid/liquid system has a tendency to be particularly unstable and leads to the introduction of severe defects in the form of a discontinuity of the film under consideration, i.e. in the example of FIG. 10 the first polymer layer 20, the initial planarity of which is thereby disrupted, with the appearance, in the best of cases, of holes in the film or the double-layer of polymer films, thus making it unusable for the intended applications.

Dewetting is a thermodynamically favorable phenomenon, the materials spontaneously seeking to minimize the surface of contact with each other. However, for all the applications intended above, it is specifically sought to avoid such a phenomenon, in order to have perfectly flat surfaces. It is also sought to avoid inter-diffusion phenomena between the layers so as to obtain clear interfaces.

A first problem that the Applicant sought to solve thus consists in avoiding the appearance of dewetting phenomena in polymer stack systems, in which at least one of the polymers is in a liquid/viscous state, and this irrespective of the polymers of the system and irrespective of the intended applications.

A second problem that the Applicant sought to solve consists in avoiding inter-diffusion phenomena at the interfaces, so as to obtain clear interfaces.

In the particular context of applications in the field of directed self-assembly, or DSA, nanolithography, block copolymers, which are capable of nano-structuring at an assembly temperature, are used as nanolithography masks. To do this, systems of stacks of liquid/viscous materials are also used. These stacks comprise a solid substrate, onto which is deposited at least one film of block copolymer, subsequently denoted BCP. This block copolymer BCP film, intended to form a nanolithography mask, is necessarily in a liquid/viscous state at the assembly temperature, so that it can self-organize in nanodomains, due to a phase segregation between the blocks. The block copolymer film thus deposited on the surface of the substrate is thus subject to dewetting phenomena when it is brought to its assembly temperature.

Furthermore, for the intended application, such a block copolymer must also preferably have nanodomains oriented perpendicular to the lower and upper interfaces of the block copolymer, so as to be able thereafter to selectively remove one of the blocks of the block copolymer, to create a porous film with the residual block(s) and to transfer, by etching, the patterns thus created onto the underlying substrate.

However, this condition of perpendicularity of the patterns is met only if each of the lower (substrate/block copolymer) and upper (block copolymer/ambient atmosphere) interfaces is "neutral" with respect to each of the blocks of said copolymer BCP, i.e. if there is no predominant affinity of the interface under consideration for at least one of the blocks constituting the block copolymer BCP.

In this perspective, the possibilities for controlling the affinity of the "lower" interface, located between the substrate and the block copolymer, are nowadays well known, and controlled. Two main techniques exist for controlling and guiding the orientation of the blocks of a block copolymer on a substrate: graphoepitaxy and chemical epitaxy. Graphoepitaxy uses a topological constraint to force the block copolymer to organize in a predefined space commensurable with the periodicity of the block copolymer. For this, graphoepitaxy consists in forming primary patterns, known as guides, on the surface of the substrate. These guides, of any chemical affinity with regard to the blocks of the block copolymer, delimit areas within which a layer of block copolymer is deposited. The guides make it possible to control the organization of the blocks of the block copolymer to form secondary patterns of a higher resolution, inside these areas. Conventionally, the guides are formed by photolithography. By way of example, among the possible solutions, if the intrinsic chemistry of the monomers constituting the block copolymer allow it, a statistical copolymer having an astutely selected ratio of the same monomers as those of the block copolymer BCP can be grafted onto the substrate, thus making it possible to balance the initial affinity of the substrate for the block copolymer BCP. This is, for example, the conventional method of choice used for a system such as PS-b-PMMA and described in the article by Mansky et al., *Science,* 1997, 275, 1458. Regarding chemical epitaxy, it uses a contrast in chemical affinities between a pattern predrawn on the substrate and the different blocks of the block copolymer. Thus, a pattern having a high affinity for only one of the blocks of the block copolymer is predrawn on the surface of the underlying substrate, in order to allow the perpendicular orientation of the blocks of the block copolymer, while the remainder of the surface shows no particular affinity for the blocks of the block copolymer. To do this, a layer comprising, on the one hand, neutral areas (consisting, for example, in a grafted statistical copolymer), with no particular affinity for the blocks of the block copolymer to be deposited and, on the other hand, areas with an affinity (consisting, for example, of a homopolymer grafted with one of the blocks of the block copolymer to be deposited and serving as an anchoring point for this block of the block copolymer) is deposited on the surface of the substrate. The homopolymer serving as an anchoring point can be produced with a width slightly greater than that of the block with which it has a preferential affinity and allows, in this case, a "pseudo-equitable" distribution of the blocks of the block copolymer on the surface of the substrate. Such a layer is said to be "pseudo-neutral" as it allows an equitable or "pseudo-equitable" distribution of the blocks of the block copolymer on the surface of the substrate, with the result that the layer does not have, in its overall nature, any preferential affinity for one of the blocks of the block copolymer. Consequently, such a chemically epitaxied layer on the surface of the substrate is considered as being neutral with regard to the block copolymer.

On the other hand, the control of the so-called "upper" interface of the system, i.e. the interface between the block copolymer and the surrounding atmosphere, remains markedly less well controlled at the present time. Among the various approaches described in the prior art, a first promising solution, described by Bates et al. in the publication entitled "Polarity-switching top coats enable orientation of sub-10 nm block copolymer domains", Science 2012, Vol. 338, pages 775-779, and in document US 2013/280497, consists in controlling the surface energy at the upper interface of a block copolymer to be nanostructured, of the poly(trimethylsilylstyrene-b-lactide), denoted PTMSS-b-PLA, type, or the poly(styrene-b-trimethylsilylstyrene-b-styrene), denoted PS-b-PTMSS-b-PS, type, by introducing an upper layer, also referred to as a "top coat" and subsequently denoted TC, deposited on the surface of the block copolymer. In this document, the top coat, which is polar, is deposited by spin coating (or "spin coating" in Anglo-Saxon terminology) on the block copolymer film to be nanostructured. The top coat is soluble in an acidic or basic aqueous solution, which allows it to be applied onto the upper surface of the block copolymer, which is insoluble in water. In the example described, the top coat is soluble in an aqueous ammonium hydroxide solution. The top coat is a statistical or alternating copolymer, the composition of which comprises maleic anhydride. In solution, the opening of the maleic anhydride ring allows the top coat to lose ammonia. During the self-organization of the block copolymer at the annealing temperature, the maleic anhydride ring of the top coat closes, the top coat undergoes a transformation into a less polar state and becomes neutral with respect to the block copolymer, thereby allowing a perpendicular orientation of the nanodomains with respect to the two lower and upper interfaces. The top coat is then removed by washing in an acidic or basic solution.

In such systems, based on stacks denoted TC/BCP/substrate, the top coat TC, applied by spin coating, is a liquid/viscous state. The block copolymer BCP is also necessarily in its liquid/viscous state, so as to be able to self-organize at the assembly temperature and create the desired patterns. Now, in the same manner as for any polymeric stack, the application of such a top coat TC layer, in the liquid or viscous state, onto a layer of block copolymer BCP which is itself in the liquid or viscous state, leads to the appearance, at the block copolymer/top coat (BCP/TC) upper interface, of the same dewetting phenomenon as that described above with regard to FIG. 10. Indeed, on account of hydrodynamic phenomena leading to the amplification of capillary waves of the top coat TC layer and of its interaction with the underlying layer of block copolymer BCP, this type of stack has a tendency to be particularly unstable and leads to the introduction of severe defects in the form of a discontinuity in the block copolymer BCP film, thus making it unsuitable for use, for example, as a nanolithography mask for electronics. Moreover, the thinner the deposited polymer film, that is to say at least once the gyration radius of a molecular chain of the polymer under consideration, the more unstable or metastable it will tend to be, especially when the surface energy of the underlying layer is different from that of said polymer and the system is left to evolve freely. Finally, the instability of the polymer film deposited on the underlying layer is generally all the more important as the "annealing temperature/annealing time" couple is high.

Regarding the first solution described by Bates et al., just after the step of depositing the top coat TC layer by spin coating, solvent remains trapped in the polymer chains, along with a less rigid "open maleate" form of the monomer. These two parameters imply, de facto, a plasticization of the material and thus a significant decrease in the glass transition temperature (Tg) of the material before thermal annealing allowing the return of said material to the anhydride form. Furthermore, the difference between the assembly temperature of the block copolymer BCP (which is 210° C. for the PS-b-PTMSS-b-PS block copolymer and 170° C. for the PTMSS-b-PLA block copolymer) relative to the glass transition temperature of the top coat TC layer (which is 214° C. for the TC-PS top coat deposited on the PS-b-PTMSS-b-PS block copolymer and 180° C. for the TC-PLA top coat deposited on the PTMSS-b-PLA block copolymer, respectively) is too small to be able to ensure the absence of a dewetting phenomenon. Finally, the assembly temperature does not make it possible either to ensure correct assembly kinetics for the formation of the patterns in the context of the intended DSA application.

Furthermore, still regarding the solution described by Bates et al., to avoid the problem of inter-diffusion or solubilization of the top coat TC layer in the underlying block copolymer BCP, the glass transition temperature Tg of the top coat TC layer must be high and greater than the assembly temperature of the block copolymer. To achieve this, the constituent molecules of the top coat TC layer are selected so as to have a high molecular mass.

The constituent molecules of the top coat TC must thus have a high glass transition temperature Tg, and also long molecular chains, so as to limit the solubilization of the top coat TC layer in the underlying block copolymer BCP and avoid the appearance of a dewetting phenomenon. These two parameters are particularly constraining in terms of synthesis. Indeed, the top coat TC layer must have a sufficient degree of polymerization so that its glass transition temperature Tg is much higher than the assembly temperature of the underlying block copolymer. Furthermore, the possible choice of the comonomers, for varying the intrinsic surface energy of the top coat TC layer so that the latter has a neutral surface energy with respect to the underlying block copolymer, is limited. Finally, in their publication, Bates et al. describe the introduction of comonomers to rigidify the chains. These added comonomers are rather carbon-based monomers, of the norbornene type, which do not promote a correct solubilization in polar/protic solvents.

On the other hand, for the correct functioning of such stacked polymer systems intended for applications in the field of directed self-assembly nanolithography, not only must dewetting and inter-diffusion phenomena be avoided so as to meet the conditions of surface planarity and clear interface, but, in addition, additional requirements must be met in order especially to allow the production of a perfect perpendicularity of the nanodomains of the block copolymer after assembly.

Among these additional requirements to be met, the top coat TC layer must be soluble in a solvent, or solvent system, in which the block copolymer BCP itself is insoluble, otherwise the block copolymer will redissolve at the time of the deposition of the top coat layer, the deposition of such a layer generally being performed by the well-known spin coating technique. Such a solvent is also known as a "block copolymer orthogonal solvent". It is also necessary for the top coat layer to be able to be easily removed, for example by rinsing in an appropriate solvent, which is itself preferably compatible with the standard electronics equipment. In the publication by Bates et al. mentioned above, the authors circumvent this point by using, as the main base of the polymer chain constituting the top coat TC, a monomer (maleic anhydride), the polarity of which changes once it is in basic aqueous solution (with the introduction of charges into the chain by acid-base reaction), and then returns to its initial uncharged form once the material has been deposited and then annealed at high temperature.

A second requirement is the fact that the top coat TC layer must preferably be neutral with respect to the blocks of the block copolymer BCP, i.e. it must have an equivalent interfacial tension for each of the various blocks of the block copolymer to be nanostructured, at the time of the heat treatment allowing structuring of the block copolymer BCP, so as to ensure the perpendicularity of the patterns relative to the interfaces of the block copolymer film.

In view of all the above-mentioned difficulties, the chemical synthesis of the top coat material may prove to be a challenge in itself. Despite the difficulties in synthesizing such a top coat layer and the dewetting and inter-diffusion phenomena to be avoided, the use of such a layer appears as being essential for orienting the nanodomains of a block copolymer perpendicular to the interfaces.

In a second solution described in the document from J. Zhang et al., Nano Lett., 2016, 16, 728-735, and also in documents WO 16/193581 and WO 16/193582, a second block copolymer, BCP No. 2, is used as top coat layer, "embedded" with the first block copolymer BCP in solution. The block copolymer BCP No. 2 comprises a block of a different solubility, for example a fluorinated block, and also of a low surface energy, thus naturally allowing segregation of the second block copolymer BCP No. 2 at the surface of the first block copolymer and rinsing in a suitable solvent, for example a fluorinated solvent, once the assembling is complete. At least one of the blocks of the second block copolymer has, at the organization temperature, a neutral surface energy with respect to all of the blocks of the first block copolymer film to be organized perpendicularly. Just like the first solution, this solution also favors the appearance of dewetting phenomena.

In a third solution, described by H. S. Suh et al., Nature Nanotech., 2017, 12, 575-581, the authors deposit the top coat TC layer by the iCVD (from the English acronym "initiated Chemical Vapour Deposition") method, which allows them to overcome the problem of the top coat TC solvent at the time of the deposition, which must be "orthogonal" to the block copolymer BCP, i.e. it must be a non-solvent for the block copolymer BCP. However, in this case, the surfaces to be covered require special equipment (an iCVD chamber) and thus involve a longer processing time than with a simple deposition by spin coating. Furthermore, the ratios of various monomers to be reacted may vary from one iCVD chamber to another, to the point that it appears necessary to make constant adjustments/corrections and perform quality control tests, in order to be able to use such a method in the electronics field.

The various solutions described above for making a stack of polymer layers with a flat surface, with clear interfaces between the layers, are not entirely satisfactory. In addition, when such a stack is intended for DSA applications, and comprises a block copolymer film to be nanostructured with nanodomains which must be oriented perfectly perpendicular to the interfaces, the existing solutions generally remain too tedious and complex to implement and do not make it possible to significantly reduce the defectivity associated with dewetting and with the imperfect perpendicularity of the patterns of the block copolymer. The envisaged solutions also appear too complex to be able to be compatible with industrial applications.

Consequently, in the context of using stacks comprising block copolymers BCP in the form of thin films, intended to be used as nanolithography masks, for applications in organic electronics, it is imperative to be able to ascertain not only that the block copolymer BCP film entirely covers the pre-neutralized surface of the substrate under consideration without dewetting thereof, and that the top coat layer entirely covers the surface of the block copolymer without dewetting, but also that the top coat layer deposited at the upper interface does not have predominant affinity for any of the blocks of the block copolymer, so as to ensure the perpendicularity of the patterns with respect to the interfaces.

Technical Problem

The aim of the invention is thus to overcome at least one of the drawbacks of the prior art. The invention is especially directed towards proposing a method for controlling the planarity of a polymer stack system, said method making it possible to avoid the appearance of dewetting phenomena of the stacked polymer layers, while at least one of the lower layers of the stack retains the possibility of being in a liquid-viscous state depending on the temperature, and also of solubilization phenomena between the various layers and inter-diffusion at the interfaces, so as to obtain stacks, the layers of which are perfectly flat and for which the interfaces between two layers are clear. The method must also be simple to perform and allow industrial implementation.

The invention is also directed towards overcoming other problems specific to applications dedicated to directed self-assembly (DSA) nanolithography. In particular, it is directed towards allowing the deposition of a top coat layer on the surface of a block copolymer, which avoids the appearance of the above-mentioned dewetting and inter-diffusion phenomena and which also has a neutral surface energy with respect to the blocks of the underlying block copolymer, so that the nanodomains of the block copolymer can become oriented perpendicular to the interfaces, at the assembly temperature of said block copolymer. It is also directed towards allowing the deposition of such a top coat layer with a solvent which is orthogonal to the underlying block copolymer, i.e. which is not liable to attack, solvate even partially or dissolve said underlying block copolymer.

BRIEF DESCRIPTION OF THE INVENTION

To this end, the invention relates to a method for manufacturing a flat polymeric stack, said method consisting in depositing on a substrate a first layer of non-crosslinked (co)polymer, and then a second layer of (co)polymer, at least one of the (co)polymer layers initially being in a liquid or viscous state, said method being characterized in that, at the time of the deposition of the upper layer on the first layer, the upper layer is in the form of a prepolymer composition, comprising one or more monomer(s) and/or dimer(s) and/or oligomer(s) and/or polymer(s) in solution, and in that an additional step consists in submitting said upper layer to a heat treatment, capable of causing a crosslinking reaction of the molecular chains within said prepolymer layer and allowing the production of a crosslinked so-called top coat layer.

Thus, the top coat layer rapidly crosslinks to form a rigid network, to the point that it has neither the time to dewet nor the physical possibility of dewetting. The upper layer thus crosslinked makes it possible to solve several different technical problems presented previously. Firstly, this crosslinking makes it possible to eliminate the dewetting inherent in the top coat layer, since the molecular movements of the top coat layer are very restricted once it has been entirely crosslinked. Secondly, this crosslinking of the upper layer also makes it possible to eliminate the typical possibilities of "liquid-liquid" dewetting of the system, where the top coat layer can be considered as a potentially deformable solid, rather than as a viscous fluid after crosslinking and once the system has been brought to a working temperature, above the glass transition temperature of the underlying polymer layer 20. Thirdly, the crosslinked top coat layer also makes it possible to stabilize the underlying polymer layer so that it does not dewet its substrate. Another noteworthy and non-negligible point is that the step of chemical synthesis of the material of the top coat layer is facilitated since it makes it possible to overcome the problems associated with the need to synthesize a material of a high molecular mass, thus offering better control over the final architecture of the material (composition, mass, etc.) and also synthetic operating conditions that are markedly less drastic (acceptable content of impurities, solvent, etc.) than in the case of materials of high molecular masses. Finally, the use of small molecular masses for the upper layer makes it possible to broaden the range of possible orthogonal solvents for this material. Indeed, it is well known that polymers of small masses are easier to solubilize than polymers of the same chemical composition which have large masses.

According to other optional characteristics of the method:
the heat treatment consists in heating the stack in a temperature range between 0° C. and 350° C., preferably between 10° C. and 300° C. and even more preferably between 20 and 150° C., for a time preferably less than 15 minutes, more preferably less than 10 minutes and even more preferably less than 5 minutes;
the prepolymer composition is a composition formulated in a solvent, or used without solvent, and which comprises at least one monomer, dimer, oligomer or polymer chemical species, or any mixture of these various species, of totally or partly identical chemical nature, and each including at least one chemical function capable of ensuring the crosslinking reaction under the effect of a heat stimulus;
the prepolymer composition also comprises a heat-activatable catalyst, chosen from radical generators, or acid generators, or base generators;
at least one of the chemical species of the prepolymer composition contains at least one fluorine and/or silicon and/or germanium atom, and/or an aliphatic carbon-based chain of at least two carbon atoms in its chemical formula;
the prepolymer composition also comprises in its formulation: a chemical species chosen from an antioxidant, a weak acid or base, which is capable of trapping said chemical species capable of initiating the crosslinking reaction, and/or one or more additives for improving the wetting and/or the adhesion, and/or the uniformity of the upper top coat layer deposited on the underlying layer, and/or one or more additives for absorbing one or more ranges of light radiations of different wavelengths, or for modifying the electrical conductivity properties of the prepolymer;
the crosslinking reaction is obtained via a radical route, or via an ionic route (cationic or anionic), or results from a condensation or addition reaction (for example Michael addition) between two derivatives including mutually compatible chemical functions;
when the crosslinking reaction is radical-mediated, the constituent monomer(s) and/or dimer(s) and/or oligomer(s) and/or polymer(s) of the prepolymer layer is (are) chosen from derivatives including unsaturations in their chemical structure, chosen from derivatives of acrylate or methacrylate or vinyl type;
more particularly, the constituent monomer(s) and/or dimer(s) and/or oligomer(s) and/or polymer(s) of the prepolymer layer are chosen from the non-exhaustive list of acrylate or diacrylate or triacrylate or multiacrylate, methacrylate, or multi-methacrylate, or polyglycidyl or vinyl, fluoroacrylate or fluoromethacrylate, vinyl fluoride or fluorostyrene, alkyl acrylate or methacrylate, hydroxyalkyl acrylate or methacrylate, alkylsilyl acrylate or methacrylate derivatives, unsaturated esters/acids such as fumaric or maleic acids, vinyl carbamates and carbonates, allylic ethers, and thiol-ene systems;
when the crosslinking is performed via a radical route, the prepolymer composition also comprises a heat-activatable catalyst, chosen from derivatives of organic peroxide type, or alternatively derivatives including a chemical function of azo type such as azobisisobutyronitrile, or alternatively derivatives of alkyl halide type;
when the crosslinking is performed by cationic route, the constituent monomer(s) and/or dimer(s) and/or oligomers(s) and/or polymer(s) of the pre-polymer layer are derivatives including chemical functions of epoxy/oxirane, or vinyl ether, cyclic ether, thiirane, thietane, trioxane, vinyl, lactone, lactam, carbonate, thiocarbonate or maleic anhydride type;
when the crosslinking is performed via a cationic route, the prepolymer composition also comprises a heat-activatable catalyst chosen from chemical derivatives that can generate a heat-activated acidic proton, such as ammonium salts, for instance triflate, ammonium trifluoroacetate or trifluoromethane sulfonate, pyridinium salts for instance pyridinium para-toluenesulfonate, phosphoric or sulfuric or sulfonic acids, or onium salts such as iodonium or phosphonium salts, or alternatively imidazolium salts;
when the crosslinking results from a condensation/addition, the constituent monomer(s) and/or dimer(s) and/or oligomer(s) and/or polymer(s) of the prepolymer layer may be chosen, in a non-exhaustive or non-limiting manner for the invention, from combination systems between a derivative of thiol or polythiol type and a derivative of epoxy, thiol/nitrile, thiol/vinyl type, or between a derivative of silane or organosilane or halosilane type and a hydroxy or amino derivative, or alternatively between a derivative of amine or polyamine type and a derivative of isocyanate, amine/epoxy, amine/aldehyde or amine/ketone type;
when the crosslinking is performed via a anionic route, the constituent monomer(s) and/or dimer(s) and/or oligomer(s) and/or polymer(s) of the prepolymer layer are derivatives of alkyl cyanoacrylate type, epoxides/oxiranes, acrylates, or derivatives of isocyanates or polyisocyanates;
when the constituent monomer(s) and/or dimer(s) and/or oligomer(s) and/or polymer(s) of the prepolymer layer are derivatives of alkyl cyanoacrylate type, the crosslinking reaction may be spontaneous at room temperature and/or may be catalyzed by the ambient moisture.

According to a first preferred form of the invention, the prepolymer composition comprises a mixture of monomer(s) and/or dimer(s) and/or oligomers(s) and/or polymer(s), in which each species includes one or more chemical functions for ensuring said crosslinking reaction, and also a reaction catalyst and/or a multitopic/multifunctional reagent allowing an addition or condensation reaction. More particularly, the prepolymer composition comprises a mixture of monomer(s) and/or dimer(s) and/or oligomers(s) and/or polymer(s), preferably comprising epoxy/oxirane functions, and a catalyst for generating an acid and/or a coreagent for performing an addition reaction on the epoxy functions.

According to this first preferred form of the invention:
- the catalyst is chosen from at least one of the following compounds: amines or polyamines, such as diethylenetriamine (DTA), isophoronediamine (IPD), 4,4'-diaminodiphenyl sulfone (DDS), hexamethylenediamine (HMDA), dicyandiamide (cyanoguanidine), or ammonium salts, such as ammonium triflate or ammonium trifluoroacetate, or ascorbic acid and derivatives thereof, chosen from sodium or magnesium ascorbate or sodium, magnesium or ammonium ascorbyl phosphate, and also the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and, more generally, reductones;
- the coreagent is, for its part, chosen from at least one of the following reagents: thiols or polythiols such as pentaerythrityl tetrakis(3-mercaptopropionate); imidazoles and imidazolium derivatives; acid anhydrides, for instance succinic anhydride or maleic anhydride; hydrazines;
- the catalyst and/or the coreagent is introduced into the prepolymer composition at a mass content of less than or equal to 80% of the total dry weight of the composition.

According to a second preferred form of the invention:
- the prepolymer composition comprises a mixture of one or more multifunctional acrylic monomer(s), of cyanoacrylate type, which are capable of spontaneously giving rise to a polymerization/crosslinking reaction at ambient or moderate temperature, in the presence of ambient moisture;
- the monomers of cyanoacrylate type are chosen from at least one of the following compounds: linear or branched alkyl cyanoacrylates, such as methyl cyanoacrylate, ethyl cyanoacrylate, butyl cyanoacrylate or octyl cyanoacrylate, neopentyl cyanoacrylate, octadecyl cyanoacrylate or 2-ethylphenyl cyanoacrylate, or alkylalkoxy cyanoacrylates, for instance 2-ethoxyethyl cyanoacrylate, or tetrahydrofurfuryl cyanoacrylate, or trifluoropropyl cyanoacrylate, or perfluoroalkyl cyanoacrylate.

According to yet other optional characteristics of the method for controlling the planarity of a polymeric stack:
- the crosslinking temperature of the layer of prepolymer composition is below the glass transition temperature Tg of the first polymer layer and the highest glass transition temperature Tg of the first polymer layer is greater than 25° C.;
- the prepolymer composition (pre-TC) also comprises a solvent chosen from solvents or solvent mixtures whose Hansen solubility parameters are such that $\delta_p \geq 10$ MPa$^{1/2}$ and/or $\delta_h \geq 10$ MPa$^{1/2}$, and with $\delta_d < 25$ MPa$^{1/2}$;
- more particularly, the solvent is chosen from alcoholic solvents such as methanol, ethanol, isopropanol, 1-methoxy-2-propanol or hexafluoroisopropanol; or water; dimethyl sulfoxide (DMSO); dimethylformamide; acetonitrile; diols such as ethylene glycol or propylene glycol; dimethylacetamide, gamma-butyrolactone, ethyl lactate, or a mixture thereof;
- the first polymer layer is in a solid form when the stack is brought to a temperature below its glass transition temperature or in a viscous-liquid form when the stack is brought to a temperature above its glass transition temperature or to its highest glass transition temperature;
- the first polymer layer is a block copolymer capable of nanostructuring at an assembly temperature, prior to the step of depositing the first layer of block copolymer, the method comprises a step of neutralizing the surface of the underlying substrate and, after the step of crosslinking the upper layer to form a crosslinked top coat layer, the method comprises a step of nanostructuring the block copolymer constituting the first layer by subjecting the stack obtained to an assembly temperature, said assembly temperature being lower than a temperature at which the top coat material behaves like a viscoelastic fluid, said temperature being higher than the glass transition temperature of said top coat material and, preferably, said assembly temperature being lower than the glass transition temperature of the top coat layer in its crosslinked form;
- the preliminary step of neutralizing the surface of the underlying substrate consists in predrawing patterns on the surface of the substrate, said patterns being predrawn by a lithography step or a sequence of lithography steps of any nature prior to the step of depositing the first layer of block copolymer, said patterns being intended to guide the organization of said block copolymer by a technique known as chemical epitaxy or graphoepitaxy, or a combination of these two techniques, in order to obtain a neutralized or pseudo-neutralized surface;
- the block copolymer comprises silicon in one of its blocks;
- when the prepolymer composition comprises a mixture of one or more multifunctional acrylic monomer(s), of cyanoacrylate type, the crosslinking temperature of the layer of prepolymer composition is below the highest glass transition temperature Tg of the block copolymer layer and the block copolymer has at least one block for which at least 40% of the composition has a glass transition temperature of greater than 25° C.;
- the first block copolymer layer is deposited on a thickness at least equal to 1.5 times the minimum thickness of the block copolymer;
- the prepolymer composition comprises a mixture of monomers and/or dimers and/or oligomers and/or polymers all bearing the same chemical functions ensuring crosslinking and each bearing different chemical groups;
- the composition of the prepolymer layer also comprises plasticizers and/or wetting agents, added as additives;
- the composition of the prepolymer layer also comprises rigid comonomers selected from derivatives including either one or more aromatic ring(s) in their structure, or monocyclic or polycyclic aliphatic structures, and having one or more chemical function(s) adapted to the targeted crosslinking reaction; and more particularly norbornene derivatives, isobornyl acrylate or methacrylate, styrene or anthracene derivatives, adamantyl acrylate or methacrylate.

The invention also relates to a method for manufacturing a nanolithography mask by directed assembly of block copolymers, said method comprising the steps according to the method just described above and being characterized in that after the step of nanostructuring the block copolymer constituting the first layer, an additional step consists in removing the top coat layer in order to leave a film of nanostructured block copolymer of a minimum thickness, and then at least one of the blocks of said block copolymer, oriented perpendicular to the interfaces, is removed in order to form a porous film suitable for use as a nanolithography mask.

According to other optional characteristics of this method:

when the block copolymer is deposited to a thickness greater than the minimum thickness, an overthickness of said block copolymer is removed simultaneously with or successively to the removal of the top coat layer, so as to leave a film of nanostructured block copolymer of a minimum thickness, and then at least one of the blocks of said block copolymer, oriented perpendicular to the interfaces, is removed so as to form a porous film that is capable of serving as a nanolithography mask;

the top coat layer and/or the overthickness of the block copolymer and/or the block(s) of the block copolymer is/are removed by dry etching;

the steps of etching the top coat layer and/or the overthickness of the block copolymer and one or more blocks of the block copolymer are performed successively in the same etching chamber, by plasma etching;

at the time of the step of crosslinking the top coat layer, the stack is subjected to localized heat treatment, on some areas of the top coat layer, so as to create crosslinked top coat areas having a neutral affinity with respect to the underlying block copolymer and non-crosslinked areas having a non-neutral affinity with respect to the underlying block copolymer;

the localized heat treatment is performed using an infrared laser or using "broad-band" light irradiation, in which a set of wavelengths is used rather than a restricted range in the case of radiation of laser type, or via a mechanical means such as a heating tip of an atomic force microscope, or alternatively via a process of "roll-to-roll" type, in which a heated nanostructured roll is placed in contact with the polymer surface by impression;

after the localized thermal crosslinking of the top coat layer, the stack is rinsed with the solvent which allowed the deposition of the prepolymer layer so as to remove the non-irradiated areas:

another prepolymer material, which is not neutral with respect to the underlying block copolymer, is deposited in the areas which have not been heat-treated beforehand and which are free of a top coat layer, then said non-neutral prepolymer material is subjected to a localized heat treatment so as to crosslink/polymerize in the predefined places;

at the moment of the step of annealing the stack at the assembly temperature of the block copolymer, nanodomains are formed perpendicular to the interfaces in areas facing the areas of the neutral crosslinked top coat layer, and nanodomains are formed parallel to the interfaces in areas of the block copolymer facing the areas free of crosslinked neutral top coat layer.

Finally, a subject of the invention is a polymeric stack comprising at least two polymer layers stacked one on the other, characterized in that the upper layer, known as the top coat, deposited on the first polymer layer is obtained by in situ crosslinking in accordance with the method described above, said stack being intended to be used in applications selected from the production of coatings for the aerospace or aeronautical or motor vehicle or wind turbine sector, inks, paints, membranes, biocompatible implants, packaging materials, or optical components, such as optical filters, or microelectronic or optoelectronic or microfluidic components.

More particularly, this stack is intended for applications in the field of directed self-assembly nanolithography, the first polymer layer is a block copolymer and the surfaces of the layer onto which the block copolymer is deposited and of the top coat layer have a neutral surface energy with respect to the blocks of the block copolymer.

Figure 1C:
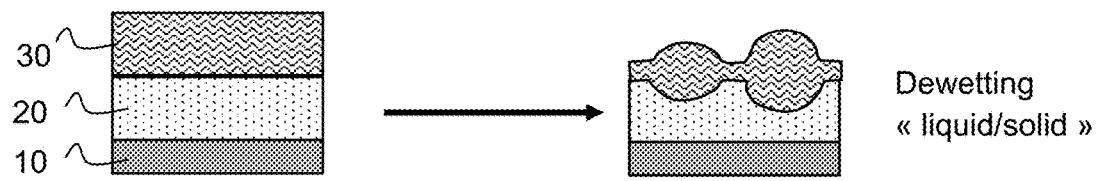
Figure 2:
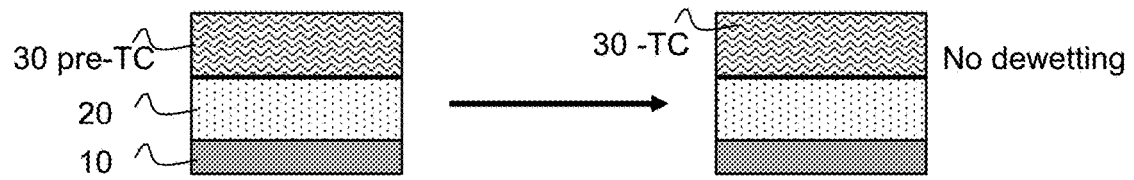
Figure 3:
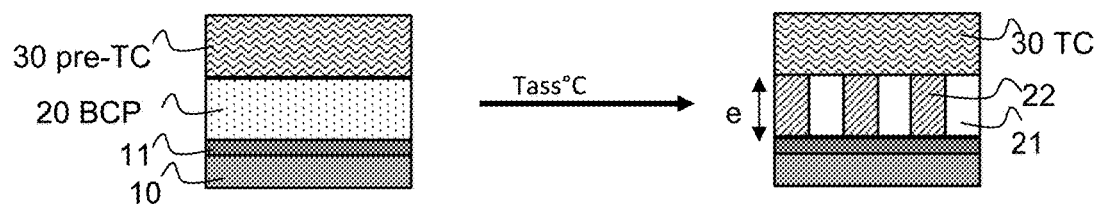
Figure 4:
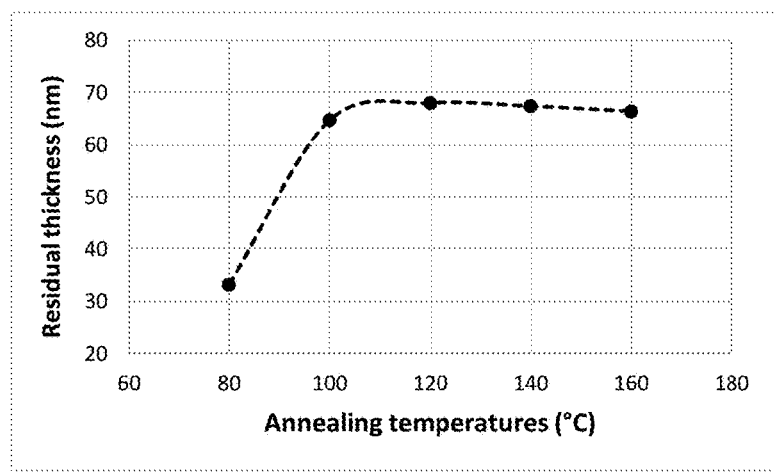
Figure 5:
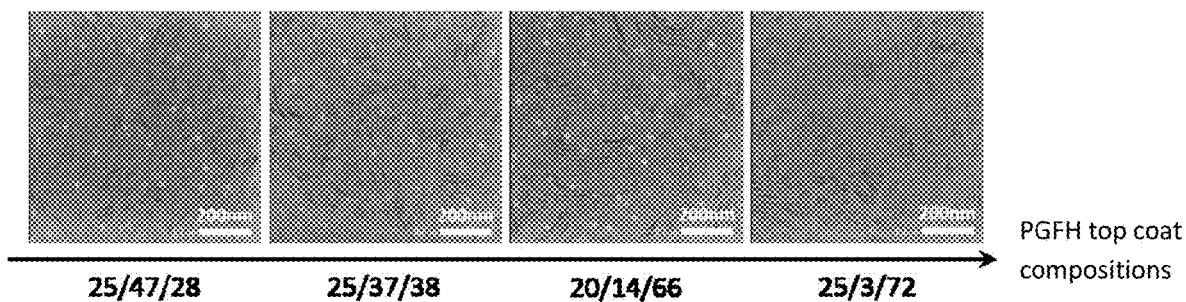
Figure 6:
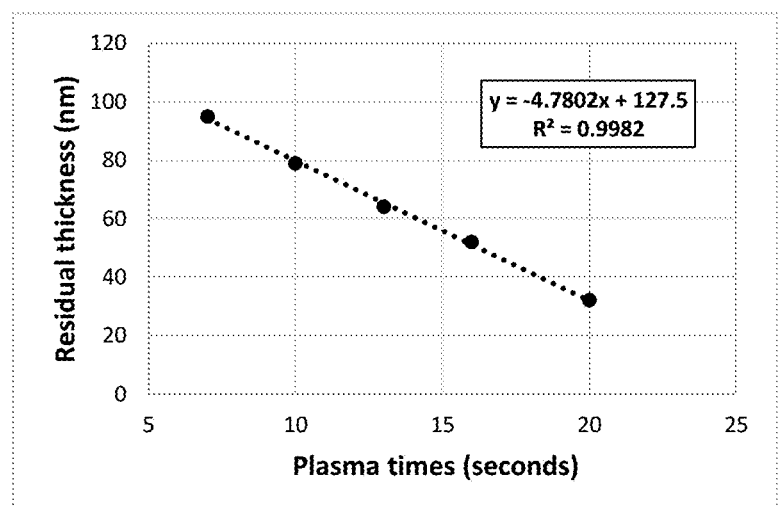
Figure 7:
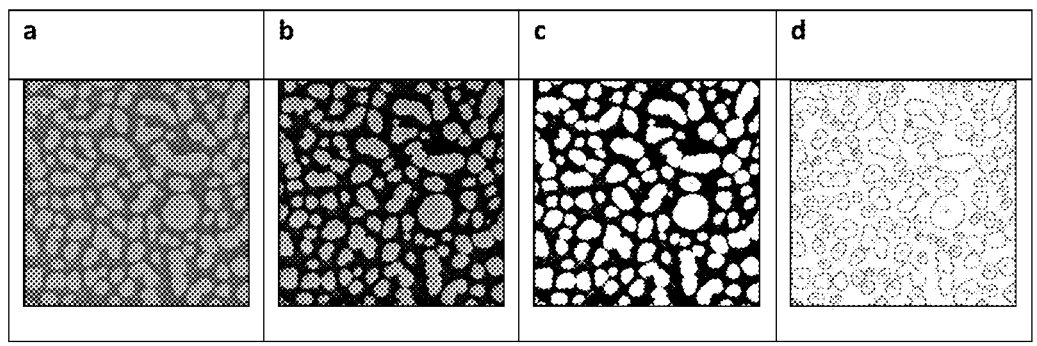
Figure 8:
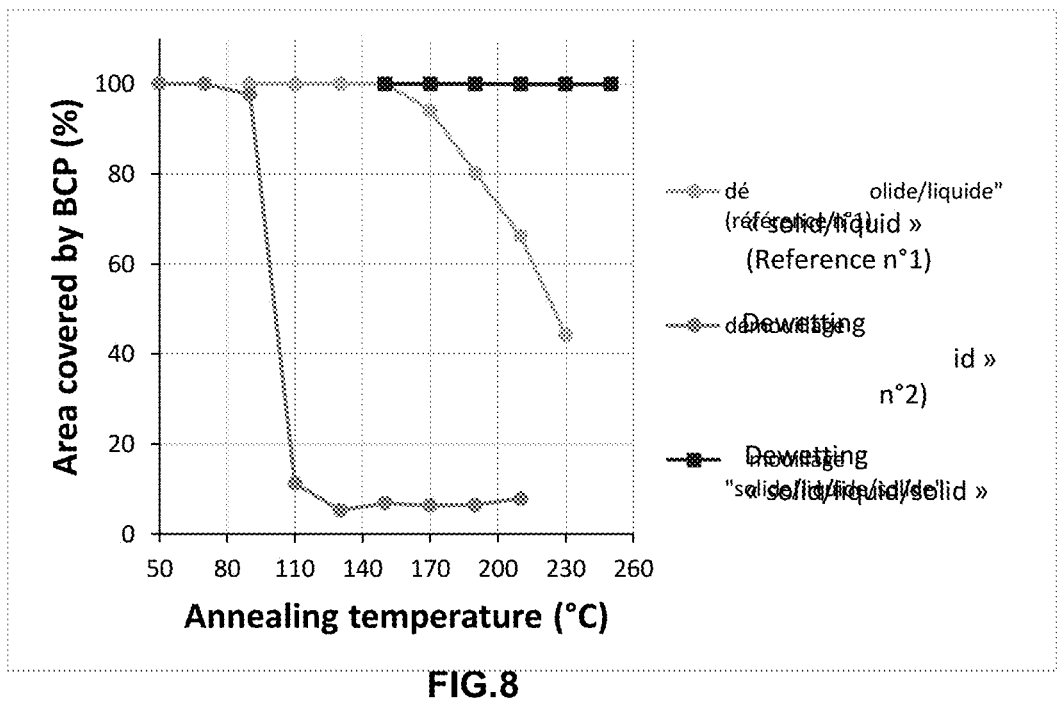
Figure 9:
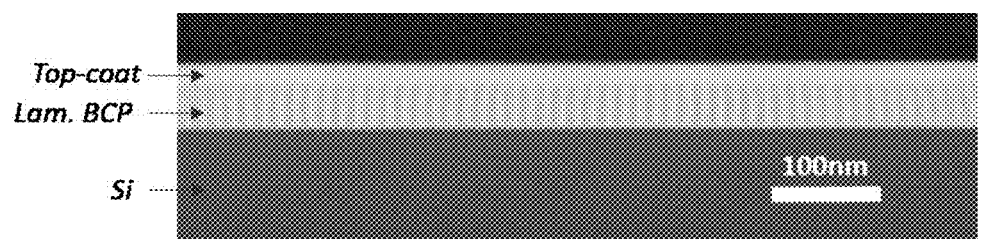
Figure 10:
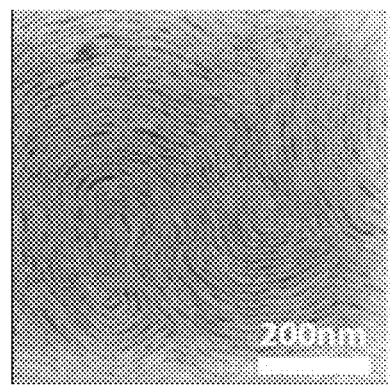

Other features and advantages of the invention will become apparent upon reading the description given by way of illustrative and non-limiting example, with reference to the appended figures, which represent:

FIGS. 1A to 10, already described, diagrams viewed in the cross section of various polymer stacks and their evolution over time, FIG. 2, already described, a diagram viewed in the cross section of a stack of polymers according to the invention, which does not undergo any dewetting or inter-diffusion phenomena, FIG. 3, a diagram viewed in the cross section of a stack according to the invention dedicated to an application in directed self-assembly (DSA) nanolithography for the production of a nanolithography mask, FIG. 4, the evolution of the residual thickness of PGFH copolymer crosslinked by heat treatment as a function of the thermal annealing, FIG. 5, images obtained by scanning electron microscopy, of self-organized block copolymer samples, for different PGFH top coat compositions used, the top coat having been crosslinked by heat treatment, FIG. 6, the evolution of the residual thickness of a PGFH copolymer, previously crosslinked by heat treatment, when it is subjected to a plasma, as a function of the plasma times, FIG. 7, the main steps of an image processing to extract the areas of interest: a) raw CDSEM image (512×512 pixels, 13495 nm×13495 nm); b) contrasting image; c) thresholded image (the white areas correspond to the areas with dewetting); d) extraction of the outline and the corresponding area of each white area of the image c), FIG. 8, the impact of the crosslinking of the top coat layer on the different possible dewettings of a stack, FIG. 9, an image of the assembly of a lamellar block copolymer (BCP no 2), seen in section by FIB-STEM preparation, after thermal crosslinking of the top coat layer, FIG. 10, a CDSEM image in top view showing the perpendicular assembly of the block copolymer (BCP no 2) of FIG. 9,

DETAILED DESCRIPTION OF THE INVENTION

By "polymers" is meant either a copolymer (of the statistical, gradient, block, alternating type) or a homopolymer.

The term "monomer" as used refers to a molecule that can undergo polymerization.

The term "polymerization" as used refers to the method of transforming a monomer or a mixture of monomers into a polymer of predefined architecture (block, gradient, statistical . . . ).

By "copolymer" is meant a polymer comprising several different monomer units.

By "statistical copolymer" is meant a copolymer in which the distribution of monomer units along the chain follows a statistical law, for example Bernoullian (zero-order Markov) or first- or second-order Markovian. When the repeating units are randomly distributed along the chain, the polymers were formed by a Bernoulli process and are called random copolymers. The term random copolymer is often used, even when the statistical process that prevailed during the synthesis of the copolymer is not known.

By "gradient copolymer" is meant a copolymer in which the distribution of the monomer units varies gradually along the chains.

By "alternating copolymer" is meant a copolymer comprising at least two monomer entities which are distributed alternately along the chains.

By "block copolymer" is meant a polymer comprising one or more uninterrupted sequences of each of the separate polymer species, the polymer sequences being chemically different from each other and being bonded together by a chemical (covalent, ionic, hydrogen, or coordination) bond. These polymer sequences are also referred to as polymer blocks. These blocks have a phase segregation parameter (Flory-Huggins interaction parameter) such that, if the degree of polymerization of each block is greater than a critical value, they are not miscible with each other and separate into nanodomains.

The above-mentioned term "miscibility" refers to the ability of two or more compounds to completely mix to form a homogeneous or "pseudo-homogeneous" phase, that is to say without apparent crystalline or near-crystalline symmetry over short or long distances. The miscibility of a mixture can be determined when the sum of the glass transition temperatures (Tg) of the mixture is strictly less than the sum of the Tg of the individual compounds taken alone.

In the description, reference is made both to "self-assembly" and to "self-organization" or to "nanostructuring" to describe the well-known phenomenon of phase separation of the block copolymers, at an assembly temperature also known as the annealing temperature.

By "minimum thickness "e" of a block copolymer is meant the thickness of a film of block copolymer serving as a nanolithography mask, below which it is no longer possible to transfer the patterns of the block copolymer film into the underlying substrate with a satisfactory final aspect ratio. In general, for the block copolymers having a high phase segregation parameter x, this minimum thickness "e" is at least equal to half the period $L_0$ of the block copolymer.

The term "porous film" refers to a block copolymer film in which one or more nanodomains have been removed, leaving holes, the shapes of which correspond to the shapes of the nanodomains that have been removed and may be spherical, cylindrical, lamellar, or helical.

By "neutral" or "pseudo-neutral" surface is meant a surface which, as a whole, does not have a preferential affinity with any of the blocks of a block copolymer. It thus allows an equitable or "pseudo-equitable" distribution of the blocks of the block copolymer on the surface.

Neutralization of the surface of a substrate allows to obtain such a "neutral" or "pseudo-neutral" surface.

The surface energy (noted γx) of a given material "x" is defined as the excess energy at the surface of the material compared to that of the material within its bulk. When the material is in liquid form, its surface energy is equivalent to its surface tension.

When reference is made to the surface energies or more specifically to the interfacial tensions of a material and of a block of a given block copolymer, these are compared at a given temperature and more particularly at a temperature which allows self-organization of the block copolymer.

By "lower interface" of a (co)polymer is meant the interface in contact with an underlying layer or substrate onto which said (co)polymer is deposited. It is noted that, in the rest of the description, when the polymer under consideration is a block copolymer to be nanostructured, intended to serve as a nanolithography mask, this lower interface is neutralized by a conventional technique, i.e. it does not have, in its overall nature, any preferential affinity for one of the blocks of the block copolymer.

By "upper interface" or "upper surface" of a (co)polymer is meant the interface in contact with an upper layer, known as the top coat and denoted TC, applied to the surface of the (co)polymer. It is noted that, in the rest of the description, when the polymer under consideration is a block copolymer to be nanostructured, intended to serve as a nanolithography mask, the upper layer of top coat TC, just like the underlying layer, preferably does not have any preferential affinity for one of the blocks of the block copolymer so that the nanodomains of the block copolymer can orient perpendicular to the interfaces at the time of annealing the assembly.

By "solvent orthogonal to a (co)polymer" is meant a solvent not capable of attacking or dissolving said (co)polymer.

By "liquid polymer" or "viscous polymer" is meant a polymer which, at a temperature greater than the glass transition temperature, has, due to its rubbery state, an increased capacity for deformation as a result of the possibility given to its molecular chains to move freely as opposed to "solid polymer" non-deformable due to the negligible mobility of its molecular chains.

In the context of this invention, any polymeric stack system, i.e. a system comprising at least two polymer layers stacked one on the other, is considered. This stack may be deposited on a solid substrate of any nature (oxide, metal, semiconductor, polymer, etc.) depending on the applications for which it is intended. The various interfaces of such a system may have a "liquid/solid" or "liquid/liquid" configuration. Thus, an upper polymer layer, being in a liquid or viscous state, is deposited on an underlying polymer layer which may be in a solid or liquid state, depending on the intended applications.

FIG. 2 illustrates such a polymeric stack. This stack is deposited, for example, on a substrate 10 and comprises, for example, two polymer layers 20 and 30 stacked one on the other. Depending on the intended applications, the first layer 20 may be not in a solid or liquid/viscous state at the time of the deposition of the second upper layer 30, known as the top coat TC. The top coat TC layer 30 is applied to the surface of the underlying layer 20, by a conventional deposition technique, for example spin coating or "spin coating", and is in a liquid/viscous state.

The term "planarity of a polymeric stack", within the meaning of the invention, applies to all the interfaces of the stack. The method according to the invention in fact makes it possible to control the planarity of the interface between the substrate 10 and the first layer 20 and/or the planarity of the interface between the first layer 20 and the top coat layer 30 and/or the planarity of the interface between the top coat layer 30 and air.

To avoid the appearance of a dewetting phenomenon of the top coat TC layer 30 just after its deposition onto the underlying layer 20, and to avoid an inter-diffusion phenomenon at the interface especially in the case of a liquid/liquid configuration of the interface, corresponding to the case represented in FIG. 10, the invention advantageously consists in depositing the upper layer 30 in the form of a prepolymer composition, denoted pre-TC, comprising one or more monomer(s) and/or dimer(s) and/or oligomer(s) and/or polymer(s). For the sake of simplicity, these compounds are also referred to as "molecules" or "entities" in the rest of the description. Said prepolymer composition pre-TC is preferably applied by spin coating. The layer of prepolymer composition thus deposited is then subjected to a heat treatment in order to cause a crosslinking reaction takes place in situ, within the deposited pre-TC prepolymer layer, and generates the creation of a TC polymer of a high molecular mass by the crosslinking of the constituent molecular chains of the deposited prepolymer composition layer. During this reaction, the initial size of the chains increases as the reaction propagates in the layer, thus greatly limiting the solubilization of the crosslinked top coat TC layer 30 in the underlying polymer layer 20 when the latter layer is in a liquid or viscous state, and proportionately delaying the appearance of a dewetting phenomenon.

Preferably, the prepolymer composition is formulated in a solvent that is orthogonal to the first layer 20 of polymer already present on the substrate, and comprises at least:
  one monomer, dimer, oligomer, or polymer chemical entity, or any mixture of these various entities, of totally or partly identical chemical nature, and each including at least one chemical function capable of ensuring the propagation of the crosslinking reaction under the effect of a stimulus.

The prepolymer composition may, in one implementation variant, be used without a solvent.

Depending on the monomer and/or dimer and/or oligomer and/or polymer chemical species of the prepolymer composition, said composition may also comprise a heat-activatable catalyst. In this case, the catalyst is chosen from radical generators, or acid generators, or base generators.

As regards the prepolymer/catalyst system, a compromise should be made so that the crosslinking reaction can take place at a sufficiently low temperature, without, however, compromising the stability of the system over time during its storage. The prepolymer/catalyst system should thus be sufficiently heat-stable so as to be able to be suitably stored, at low temperature if need be, without losing its crosslinking/polymerization properties. It should also be sufficiently heat-unstable to allow the production of a crosslinking/polymerization reaction at low temperature, preferably of about 100° C., for a few minutes. Finally, the catalyst should also have an evaporation temperature that is compatible with the crosslinking temperature of the prepolymer composition, so as to prevent the catalyst from evaporating before it has had the chance to react.

Preferentially, in the context of the invention, at least one of the chemical entities of the prepolymer composition has at least one fluorine and/or silicon and/or germanium atom, and/or an aliphatic carbon-based chain of at least two carbon atoms in its chemical formula. Such entities make it possible to improve the solubility of the prepolymer composition in a solvent that is orthogonal to the underlying polymer layer 20 and/or to efficiently modify the surface energy of the top coat TC layer if need be, especially for DSA applications, and/or to facilitate wetting of the prepolymer composition on the underlying (co)polymer layer 20, and/or to reinforce the strength of the top coat TC layer with respect to a subsequent step of plasma etching.

Optionally, this prepolymer composition may further comprise in its formulation:
  a chemical entity selected from an antioxidant, a weak acid or base, which is capable of trapping said chemical entity capable of initiating the crosslinking reaction, and/or
  one or more additives for improving the wetting and/or the adhesion, and/or the uniformity of the upper top coat layer, and/or
  one or more additives for absorbing one or more ranges of light radiations of different wavelengths, or for modifying the electrical conductivity properties of the prepolymer.

The heat treatment for bringing about the crosslinking reaction consists in heating the stack in a temperature range between 0° C. and 350° C., preferably between 10° C. and 300° C. and even more preferably between 20 and 150° C., for a time preferably less than 15 minutes, more preferably less than 10 minutes and even more preferably less than 5 minutes. Even more advantageously, the heat treatment is below 110° C. for 2 minutes of reaction.

The crosslinking reaction may be obtained via a radical route, or via an ionic route, or it may result from a condensation or addition reaction (for example Michael addition) between two derivatives including mutually compatible chemical functions. In the case where the crosslinking results from an addition or condensation reaction, the prepolymer composition may also comprise a multitopic/multifunctional coreagent.

When the polymerization is radical-mediated, the constituent monomer(s) and/or dimer(s) and/or oligomer(s) and/or polymer(s) of the prepolymer layer are chosen from derivatives including unsaturations in their chemical structure, chosen from derivatives of acrylate or methacrylate or vinyl type. More particularly the constituent monomer(s) and/or dimer(s) and/or oligomer(s) and/or polymer(s) of the prepolymer layer are selected from the non-exhaustive list of acrylate or diacrylate or triacrylate or multi-acrylate, methacrylate, or multi-methacrylate, or polyglycidyl or vinyl, fluoroacrylate or fluoromethacrylate, vinyl fluoride or fluorostyrene, alkyl acrylate or methacrylate, hydroxyalkyl acrylate or methacrylate, alkylsilyl acrylate or methacrylate derivatives, unsaturated esters/acids such as fumaric or maleic acids, vinyl carbamates and carbonates, allyl ethers, and thiol-ene systems.

In this case, the heat-activatable catalyst is chosen from derivatives of organic peroxide type, or alternatively derivatives including a chemical function of azo type such as azobisisobutyronitrile, or alternatively derivatives of alkyl halide type.

When the polymerization is cationic, the constituent monomer(s) and/or dimer(s) and/or oligomers(s) and/or polymer(s) of the pre-polymer layer are derivatives including chemical functions of the epoxy/oxirane, or vinyl ether, cyclic ether, thiirane, thietanes, trioxane, vinyl, lactone, lactam, carbonate, thiocarbonate, and maleic anhydride type. The catalyst, for its part, may be chosen from chemical derivatives that can generate a heat-activated acidic proton, such as ammonium salts, for instance triflate, ammonium trifluoroacetate or trifluoromethane sulfonate, pyridinium salts for instance pyridinium para-toluenesulfonate, phosphoric or sulfuric or sulfonic acids, or onium salts such as iodonium or phosphonium salts, or alternatively imidazolium salts.

When the polymerization/crosslinking results from a condensation/addition, the constituent monomer(s) and/or dimer(s) and/or oligomers(s) and/or polymer(s) of the pre-polymer layer may be chosen, in a non-exhaustive or non-limiting manner for the invention, from combination systems between:

a derivative of thiol or polythiol type and a derivative of epoxy, thiol/nitrile, thiol/vinyl type, or between a derivative of silane or organosilane or halosilane type and a hydroxy or amino derivative, or between a derivative of amine or polyamine type and a derivative of isocyanate, amine/epoxy, amine/aldehyde or amine/ketone type.

Finally, when the polymerization is anionic, the constituent monomer(s) and/or dimer(s) and/or oligomer(s) and/or polymer(s) of the prepolymer layer are derivatives of alkyl cyanoacrylate type, epoxides/oxiranes, acrylates, or derivatives of isocyanates or polyisocyanates.

In the particular case in which the constituent monomer(s) and/or dimer(s) and/or oligomer(s) and/or polymer(s) of the prepolymer layer are derivatives of alkyl cyanoacrylate type, the crosslinking reaction may be spontaneous at room temperature and/or may be catalysed by the ambient moisture.

According to a first embodiment, the constituent monomer(s) and/or dimer(s) and/or oligomers(s) and/or polymer(s) of the prepolymer composition pre-TC preferably comprise epoxy/oxirane functions that are reactive with respect to temperature, in the presence of a reaction catalyst for generating an acid and/or a coreagent that is capable of generating a reagent for performing an addition reaction on the epoxy functions. The pre-polymer/(catalyst+additive) ratio is preferably at most 1:1 by mass.

In this case, the monomer and/or oligomer and/or polymer species of the composition may be chosen, for example, from copolymers based on acrylate chemistry, having an architecture of monomers such as a statistical or gradient copolymer of glycidyl methacrylate-co-trifluoroethyl methacrylate-co-hydroxyethyl methacrylate or of glycidyl methacrylate-co-trifluoroethyl methacrylate-co-butyl methacrylate.

According to this first embodiment of the invention, the catalyst is chosen from at least one of the following compounds: amines or polyamines, such as diethylenetriamine (DTA), isophoronediamine (IPD), 4,4'-diaminodiphenyl sulfone (DDS), hexamethylenediamine (HMDA), dicyandiamide (cyanoguanidine), or ammonium salts, such as ammonium triflate or ammonium trifluoroacetate or ammonium trifluoromethane sulfonate, pyridium salts such as pyridinium para-toluenesulfonate, or ascorbic acid and derivatives thereof, chosen from sodium or magnesium ascorbate or sodium, magnesium or ammonium ascorbyl phosphate, and also the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and, more generally, reductones.

The coreagent is, for its part, chosen from at least one of the following reagents: thiols or polythiols such as pentaerythrityl tetrakis(3-mercaptopropionate); imidazoles and imidazolium derivatives; acid anhydrides, for instance succinic anhydride or maleic anhydride; hydrazines.

Most of the known thermosetting systems are formed from a mixture of two compounds which react with each other at the desired temperature, mixing being performed just before use due to the high reactivity of the system. However, for certain applications, for instance those dedicated to electronics, in which it is necessary to precisely dose the constituents of the mixture each time that they are deposited on a underlying layer, mixing the two compounds just before use appears complicated to perform to produce the top coat layer of a polymeric stack. Consequently, the constituent compounds of the prepolymer composition, i.e. the monomer(s) and/or dimer(s) and/or oligomer(s) and/or polymer(s) and the catalyst must be able to be mixed in solution. The prepolymer composition, the crosslinking reaction of which is activated by a temperature increase, must also be sufficiently stable over time to avoid any problem of degradation of the chemical properties.

The solvent for the prepolymer layer is selected so as to be entirely "orthogonal" to the polymeric system of the underlying layer so as to avoid a possible redissolution of this polymer in the solvent for the prepolymer layer during the deposition step (for example by spin coating). The solvents for each respective layer will thus be very dependent on the chemical nature of the polymer material already deposited on the substrate. Thus, if the polymer already deposited is sparingly polar/protic, its solvent being selected from sparingly polar and/or sparingly protic solvents, it will thus be possible to solubilize and deposit the prepolymer layer on the first polymer layer using solvents that are rather polar and/or protic. Conversely, if the polymer already deposited is rather polar/protic, it will be possible to select the solvents for the prepolymer layer from sparingly polar and/or sparingly protic solvents. According to a preferred embodiment of the invention, but without this being restrictive in view of what has been stated above, the prepolymer layer is deposited from polar and/or protic solvents/mixture of solvents. More precisely, the polarity/proticity properties of the different solvents are described according to Hansen nomenclature of solubility parameters (Hansen, Charles M. (2007) *Hansen solubility parameters: a user's handbook*, CRC Press, ISBN 0-8493-7248-8), where the designation "$\delta_d$" represents the forces of dispersion between solvent/solute molecules, "$\delta_p$" represents the energy of dipole forces between molecules, and "$\delta_h$" represents the energy of possible hydrogen bonding forces between molecules, the values of which are tabulated at 25° C. In the context of the invention, "polar and/or protic" is defined as a solvent/molecule or solvent mixture having a polarity parameter such that $\delta_p \geq 10$ MPa$^{1/2}$ and/or a hydrogen bonding parameter such that $\delta_h \geq 10$ MPa$^{1/2}$. Similarly, a solvent/molecule or solvent mixture is defined as "low polar and/or protic" when the Hansen solubility parameters are such that $\delta_p < 10$ MPa$^{1/2}$ and/or $\delta_h < 10$ MPa$^{1/2}$, and preferably $\delta_p \leq 8$ MPa$^{1/2}$, and/or a hydrogen bonding parameter such that MPa$^{1/2}$.

According to a embodiment of the invention but non-restrictive embodiment of the invention, the solvent for the prepolymer composition may be chosen, for example, from polar protic and/or polar aprotic solvents, for instance alcohols such as methanol, ethanol, isopropanol, 1-methoxy-2-propanol or hexafluoroisopropanol; or water; dimethyl sulfoxide (DMSO); dimethylformamide; acetonitrile; diols such as ethylene glycol or propylene glycol; dimethylacetamide, gamma-butyrolactone, ethyl lactate, or a mixture thereof.

More generally, in the context of one of the preferential but non-exhaustive embodiments of the invention, the various constituents of the prepolymer layer are soluble and stable in solvents, the Hansen solubility parameters of which are such that $\delta_p \geq 10$ MPa$^{1/2}$ and/or $\delta_h \geq 10$ MPa$^{1/2}$ as defined previously, and with the dispersion parameter $\delta_d < 25$ MPa$^{1/2}$.

Preferably, the crosslinking temperature $T_r$ is below the glass transition temperature Tg of the underlying polymer layer 20 so as to ensure the absence of dewetting.

However, in certain cases, the crosslinking temperature $T_r$ may be above the glass transition temperature Tg of the underlying polymer layer 20. In such a situation, the stack of the polymer layer 20 and of the layer of prepolymer composition 30 is in a liquid/liquid configuration which favours dewetting and inter-diffusion. A competition then becomes established between the crosslinking reaction of the prepolymer composition to form the crosslinked top coat TC layer and the appearance of dewetting of the deposited layer of prepolymer composition. In order to ensure the total absence of deformation of the stack, due to dewetting of the layer of prepolymer composition before it has completely crosslinked, it is thus necessary to ensure, in this case, that the crosslinking reaction is markedly faster than the hydrodynamic processes leading to dewetting.

To do this, the catalyst is advantageously chosen as a function of its catalytic activity, but also as a function of the activation temperature at which it allows the crosslinking to be activated. The temperature $T_r$ of the crosslinking reaction may in point of fact be chosen so as to obtain a crosslinking rate that is faster than the dewetting kinetics, without, however, degrading the stack.

To this end, "flash" crosslinking, with a duration from a few seconds to a few tens of seconds, for example between 2 and 50 seconds, may advantageously be envisaged in order to ensure the absence of dewetting. Amines or polyamines, such as diethylenetriamine (DTA), isophoronediamine (IPD), 4,4'-diaminodiphenyl sulfone (DDS), hexamethylenediamine (HMDA), dicyandiamide (cyanoguanidine), or ammonium salts, such as ammonium triflate or ammonium trifluoroacetate, or ascorbic acid and derivatives thereof, chosen from sodium or magnesium ascorbate or sodium, magnesium or ammonium ascorbyl phosphate, and also the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and, more generally, reductones appear to be catalysts of choice since they not only allow a rapid crosslinking reaction, with kinetics of less than or equal to 3 minutes, but they also make it possible to lower the crosslinking temperature of the polymer to a more attainable temperature range, typically below 300° C., preferably below 250° C., and more preferably below 150° C.

If the crosslinking reaction results from addition/condensation reactions, a coreagent may be chosen from thiols or polythiols such as pentaerythrityl tetrakis(3-mercaptopropionate); imidazoles and imidazolium derivatives; acid anhydrides, for instance succinic anhydride or maleic anhydride; hydrazines. Such a coreagent also allows the production of a rapid crosslinking reaction, with kinetics of less than or equal to 3 minutes, at a temperature below 300° C. and which may preferably be below 150° C.

If the crosslinking reaction takes place as a radical-mediated reaction, the catalyst may also be chosen from chemical derivatives of organic peroxide type, or alternatively derivatives including a chemical function of azo type such as azobisisobutyronitrile, or alternatively derivatives of alkyl halide type. In this case also, the catalyst allows the production of a rapid crosslinking reaction, with kinetics of less than or equal to 3 minutes, at a temperature below 300° C., preferably below 250° C. and more preferably below 150° C.

Preferably, the catalyst or the reagent/coreagent (in the case of crosslinking resulting from addition/condensation reactions) is introduced into the prepolymer composition at a mass content of less than or equal to 80% of the total dry weight of the composition.

In a second embodiment, the prepolymer composition pre-TC comprises one or more multifunctional acrylic monomers, such as cyanoacrylate derivatives. These cyanoacrylate derivatives are chosen from at least one of the following compounds: linear or branched alkyl cyanoacrylates, such as methyl cyanoacrylate, ethyl cyanoacrylate, butyl cyanoacrylate or octyl cyanoacrylate, neopentyl cyanoacrylate, octadecyl cyanoacrylate or 2-ethylphenyl cyanoacrylate, or alkylalkoxy cyanoacrylates, for instance 2-ethoxyethyl cyanoacrylate, or tetrahydrofurfuryl cyanoacrylate, or trifluoropropyl cyanoacrylate, or perfluoroalkyl cyanoacrylate.

In this case, the presence of a catalyst in the prepolymer composition is not necessary, since the polymerization/crosslinking reaction of these derivatives is spontaneous at room temperature (i.e. at a temperature between 15° C. and 30° C.). To allow the production of a spontaneous reaction, the crosslinking temperature $T_r$ must be below the glass transition temperature Tg of the underlying polymer layer. Furthermore, the highest glass transition temperature of the first underlying polymer layer must itself be above room temperature, i.e. above 25° C.

According to this embodiment, the reagent compound (of cyanoacrylate type) is alone in its phase, or as a mixture with another cyanoacrylate derivative bearing different substituents, and in the initial monomer form or in the form of a monomer mixture having the same chemical functions which ensure crosslinking. The crosslinking reaction can then be induced simply by the moisture of the ambient atmosphere, according to the mechanism represented by reaction (I) below.

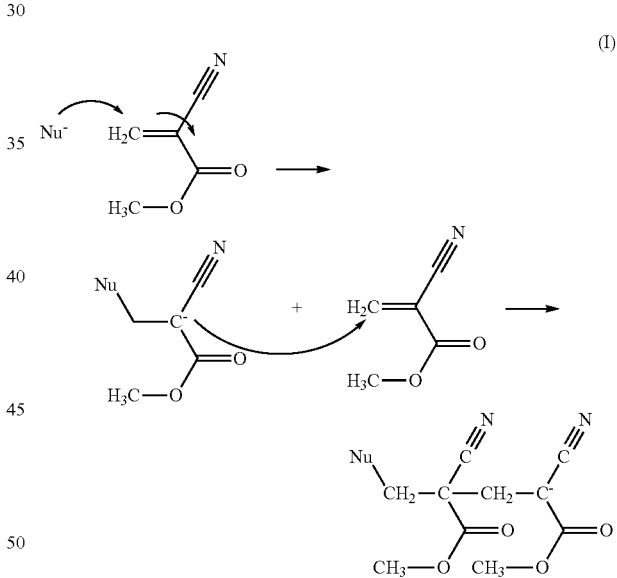

Water or alcohol may also be dispensed on the layer of prepolymer composition in order to accelerate the crosslinking reaction.

In this case, the crosslinking reaction then takes place at a very moderate temperature, typically between 5° C. and 100° C. and preferably less than or equal to 30° C. Furthermore, this crosslinking reaction has the advantage of being rapid, typically from a few tens of seconds to a few minutes and in all cases less than 5 minutes.

The monomers of cyanoacrylate type may be stored without degradation over a correct period of time, from a few weeks to a few months, by means of a few elementary precautions, for instance storage under a dry/controlled atmosphere, at low temperature, etc.

The monomer or monomer mixture may be dissolved in a solvent that is orthogonal to the underlying polymer layer 20, which may be chosen, for example, from the polar protic and/or polar aprotic solvents mentioned above, for instance alcohols such as methanol, ethanol, isopropanol, 1-methoxy-2-propanol or hexafluoroisopropanol; or water; dimethyl sulfoxide (DMSO); dimethylformamide; acetonitrile; diols such as ethylene glycol or propylene glycol; dimethylacetamide, gamma-butyrolactone, ethyl lactate, or a mixture thereof. Preferably, in the context of this second embodiment, the solvent is polar and aprotic.

In certain cases, when the monomer or monomer mixture has a low viscosity at room temperature, for example below 50 centipoises, it may then be deposited in pure form on the underlying layer, i.e. without solvent.

From a practical viewpoint, the crosslinking temperature may be obtained, for example, by a simple hotplate, without, however, this single example being limiting for the present invention. Thus, in another example, it is possible to heat the layer of prepolymer composition using an infrared laser or a broadband spectrum lamp whose wavelengths are localized in the infrared range, such as from 800 to 1500 nm, for example.

The invention as described above applies to any type of polymeric stack. Among the diverse and varied applications of such stacks, the Applicant was more particularly interested on directed self-assembly, or DSA, nanolithography. However, the invention is not limited to this example, which is given for illustrative and in no way limiting purposes. Indeed, in the context of such an application, the top coat TC upper layer must also satisfy other additional requirements, in order especially to allow the nanodomains of the underlying copolymer to orient perpendicular to the interfaces.

FIG. 3 illustrates such a polymeric stack dedicated to an application in the organic electronics field. This stack is deposited on the surface of a substrate 10. The surface of the substrate is neutralized, or pseudo-neutralized, beforehand by a conventional technique. To do this, the substrate 10 does or does not include patterns, said patterns being pre-drawn by a lithography step or a sequence of lithography steps of any nature prior to the step of depositing the first layer (20) of block copolymer (BCP), said patterns being intended to guide the organization of said block copolymer (BCP) by a technique known as chemical epitaxy or graphoepitaxy, or a combination of these two techniques, in order to obtain a neutralized surface. One particular example consists in grafting a layer 11 of a statistical copolymer including an astutely selected ratio of the same monomers as those of the block copolymer BCP 20 deposited on top. The layer 11 of the statistical copolymer makes it possible to balance the initial affinity of the substrate for the block copolymer BCP 20. The grafting reaction can be obtained by any thermal, photochemical, or oxidation-reduction means, for example. Next, a top coat TC layer 30 is deposited on the layer of block copolymer BCP 20. This TC layer 30 should not have any preferential affinity with respect to the blocks of the block copolymer 20 so that the nanodomains 21, 22 which are created at the time of annealing at the assembly temperature Tass orient perpendicular to the interfaces, as illustrated in FIG. 3. The block copolymer is necessarily liquid/viscous at the assembly temperature, so it can nanostructure. The top coat TC layer 30 is also deposited on the block copolymer 20 in a liquid/viscous state. The interface between the two polymer layers is thus in a liquid/liquid configuration which favors inter-diffusion and dewetting phenomena.

As regards the layer 20 of block copolymer to be nanostructured, also denoted BCP, it comprises "n" blocks, n being any integer greater than or equal to 2. The block copolymer BCP is more particularly defined by the following general formula:

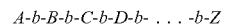

where A, B, C, Z are blocks "i" ... "j" representing either pure chemical entities, i.e. each block is a set of monomers of identical chemical natures, polymerized together, or a set of comonomers, copolymerized together, totally or partly in the form of a block or statistical or random or gradient or alternating copolymer.

Each of the blocks "i" ... "j" of the block copolymer BCP to be nanostructured can thus potentially be written in the form: $i=a_i\text{-co-}b_i\text{-co-}\ldots\text{-co-}z_i$, with $i\neq\ldots\neq j$, in all or part.

The volume fraction of each entity $a_i \ldots z_i$ can be from 1% to 99%, by monomer units, in each of the blocks i ... j of the block copolymer BCP.

The volume fraction of each of the blocks i ... j can be from 5% to 95% of the block copolymer BCP.

The volume fraction is defined as being the volume of an entity relative to that of a block, or the volume of a block relative to that of the block copolymer.

The volume fraction of each entity of a block of a copolymer, or of each block of a block copolymer, is measured in the manner described below. Within a copolymer in which at least one of the entities, or one of the blocks if it is a block copolymer, includes several comonomers, it is possible to measure, by proton NMR, the mole fraction of each monomer in the entire copolymer, and then to work back to the mass fraction by using the molar mass of each monomer unit. In order to obtain the mass fractions of each entity of a block, or each block of a copolymer, it is then enough to add the mass fractions of the constituent comonomers of the entity or of the block. The volume fraction of each entity or block can then be determined from the mass fraction of each entity or block and from the density of the polymer formed by the entity or block. However, it is not always possible to obtain the density of polymers, the monomers of which are copolymerized. In this case, the volume fraction of an entity or of a block is determined from its mass fraction and from the density of the compound which is predominant by mass in the entity or block.

The molecular mass of the block copolymer BCP can be from 1000 to 500,000 g·mol$^{-1}$.

The block copolymer BCP may have any type of architecture: linear, star (three or multiple arms), grafted, dendritic, comb.

Each of the blocks i ... j of a block copolymer has a surface energy, denoted $\gamma_i \ldots \gamma_j$, which is specific to it and which depends on its chemical constituents, i.e. on the chemical nature of the monomers or comonomers composing it. Likewise, each of the constituent materials of a substrate have their own surface energy value.

Each of the blocks i ... j of the block copolymer also has an interaction parameter of Flory-Huggins type, denoted: $\chi_{ix}$, when it interacts with a given material "x", which can be a gas, a liquid, a solid surface, or another polymer phase for example, and an interfacial energy denoted "$\gamma_{ix}$", with $\gamma_{ix}=\gamma_i-(\gamma_x \cos\theta_{ix})$, where $\theta_{ix}$ is the contact angle between the materials i and x. The interaction parameter between two blocks i and j of the block copolymer is thus denoted $\chi_{ij}$.

There is a relationship linking $\gamma_i$ and the Hildebrand solubility parameter $\delta_i$ of a given material i, as described in the document Jia & al., *Journal of Macromolecular Science*, B, 2011, 50, 1042. In point of fact, the Flory-Huggins interaction parameter between two given materials i and x is indirectly linked to the surface energies $\gamma_i$ and $\gamma_x$ specific to the materials, and it is consequently possible to speak either in terms of surface energies, or in terms of interaction parameter to describe the physical phenomenon occurring at the interface of the materials.

When we speak of surface energies of a material and of those of a given block copolymer BCP, it is implied that the surface energies are compared at a given temperature, and this temperature is that (or forms at least part of the temperature range) which allows the self-organization of the BCP.

In the same manner as described previously for any stack of polymers, the upper layer 30, which is deposited on the layer 20 of block copolymer BCP, is in the form of a prepolymer composition, denoted pre-TC, and comprises one or more monomer(s) and/or dimer(s) and/or oligomer(s) and/or polymer(s). By means of thermal activation of the layer of prepolymer composition thus deposited, a cross-linking reaction of the constituent molecular chains of the prepolymer layer takes place in situ, in the deposited pre-TC prepolymer layer, and gives rise to the creation of a TC polymer of a high molecular mass. A single polymer chain is then created, which is extremely sparingly miscible with the underlying block copolymer BCP, thus greatly limiting the solubilization of the top coat TC layer 30 in the underlying layer 20 of block copolymer BCP and proportionately delaying the appearance of a dewetting phenomenon. Thus, the thermo-crosslinking/thermo-polymerization of the top coat TC layer 30 makes it possible to avoid not only the problems of inter-diffusion and dewetting of the top coat TC layer 30 on the underlying block copolymer BCP 20, but also to stabilize the block copolymer layer 20 so that it does not dewet from its substrate 10. The crosslinking of the top coat TC layer 30 thus makes it possible to obtain a stack, the surface of which is perfectly flat, with perfectly clear substrate/block copolymer (substrate/BCP) and block copolymer/top coat (BCP/TC) interfaces.

Such a top coat TC layer thus crosslinked has a surface energy, at the temperature allowing the self-assembly of the underlying block copolymer BCP 20, between 10 and 50 mN/m, preferably between 20 and 45 mN/m and more preferably between 25 and 40 mN/m.

However, the thermo-crosslinking/thermo-polymerization reaction involves chemical species, such as carbanions, carbocations, or radicals, which are more reactive than a simple non-crosslinkable top coat layer. It is consequently possible, in some cases, for these chemical species to be able to diffuse and possibly degrade the block copolymer BCP 20. Such diffusion is very limited, over a thickness of at most a few nanometers and in all cases less than 10 nm, due to the immiscible nature of the top coat TC layer 30 and the block copolymer BCP layer 20. As a result of such diffusion, the effective thickness of the block copolymer layer may thereby be reduced. To compensate for this possible diffusion, the block copolymer BCP 20 can be deposited to a greater thickness (e+E), for example at least 1.5 times the minimum thickness e of the block copolymer. In this case, after nanostructuring and at the time of the removal of the top coat TC layer, the block copolymer overthickness E is also removed to retain only the lower part, of a minimum thickness e, of the block copolymer.

In any case, if any, the diffusion is limited to a thickness of a few nanometers at most, it forms an intermediate layer comprising an intimate mixture of the constituents of the copolymer BCP 20 block and the top coat TC layer 30. This intermediate layer then has an intermediate surface energy, between that of the pure top coat TC 30 and that of the average surface energy of the blocks of the block copolymer BCP 20, so that it has no particular affinity with one of the blocks of the block copolymer BCP and therefore makes it possible to orient the nanodomains of the underlying block copolymer BCP 20 perpendicularly to the interfaces.

Advantageously, the deposition of a prepolymer layer followed by its crosslinking, makes it possible to be free of problems linked to the need to synthesize a high molecular weight top coat material. It is indeed sufficient to synthesize monomers, dimers, oligomers, or polymers, the molecular weights of which are much more reasonable, typically of the order of one order of magnitude less, thus limiting the difficulties and operating conditions specific to the chemical synthesis step. The crosslinking of the prepolymer composition then allows these high molecular weights to be generated in situ.

Depositing a prepolymer composition, comprising monomers, dimers, oligomers, or polymers of a molecular mass much lower than a non-crosslinked top coat material, also makes it possible to broaden the possible range of solvents for the top coat TC material, where these solvents have to be orthogonal to the block copolymer BCP.

Most of the known thermosetting systems are formed from a mixture of two compounds which react with each other at the desired temperature, mixing being performed just before use due to the high reactivity of the system. However, mixing the two compounds just before use appears to be complicated to perform to produce a top coat layer of a polymeric stack dedicated to directed self-assembly nanolithography. Specifically, in such a case, it would need to be possible to measure out precisely the constituents of the mixture, each time that they are deposited on a underlying layer of block copolymer BCP, in order to be able to ensure that the crosslinked top coat TC layer is neutral with respect to the blocks of the block copolymer BCP and thus to ensure that the nanodomains of the block copolymer can be oriented perpendicular to the interfaces at the time of annealing at the assembly temperature. Now, when a mixture of two chemical compounds is involved, the neutrality of the crosslinked top coat TC layer may depend on the ratio between the two compounds.

Consequently, the constituent compounds of the prepolymer composition must be able to be mixed in solution. The prepolymer composition, the crosslinking reaction of which is activated by a temperature increase, must also be sufficiently stable over time to avoid any problem of degradation of the chemical properties.

In the same manner as described above and according to a first embodiment, the prepolymer composition comprises a mixture of monomer(s) and/or dimer(s) and/or oligomers(s) and/or polymer(s), preferably bearing epoxy/oxirane functions, and of a reaction catalyst and/or a coreagent, in solution.

According to the first embodiment of the invention, the monomers/oligomers/polymers of the composition may be chosen, for example, from copolymers based on acrylate chemistry, having an architecture of monomers such as a statistical or gradient copolymer of glycidyl methacrylate-co-trifluoroethyl methacrylate-co-hydroxyethyl methacrylate or of glycidyl methacrylate-co-trifluoroethyl methacrylate-co-butyl methacrylate.

The catalyst is chosen from at least one of the following compounds: amines or polyamines, such as diethylenetriamine (DTA), isophoronediamine (IPD), 4,4'-diaminodiphenyl sulfone (DDS), hexamethylenediamine (HMDA), dicyandiamide (cyanoguanidine), or ammonium salts, such as ammonium triflate or ammonium trifluoroacetate or ammonium trifluoromethane sulfonate, pyridinium salts such as pyridinium para-toluenesulfonate, or ascorbic acid and derivatives thereof, chosen from sodium or magnesium ascorbate or sodium, magnesium or ammonium ascorbyl phosphate, and also the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and, more generally, reductones.

The coreagent, used when the crosslinking reaction results from addition/condensation reactions, is chosen from thiols or polythiols such as pentaerythrityl tetrakis(3-mercaptopropionate); imidazoles and imidazolium derivatives; acid anhydrides, for instance succinic anhydride or maleic anhydride; hydrazines.

In this case, the total surface energy of the crosslinked top coat TC material will be modified by the chemical nature of the group which adds to the reactive function. Thus, if we consider the addition of triphenylamine (TPA) to glycidyl methacrylate (GMA), the GMA/TPA couple should be taken into account rather than GMA alone for the calculation of the surface energy.

The solvent for the prepolymer composition may be chosen, for example, from polar protic solvents, for instance alcohols such as methanol, ethanol, isopropanol, 1-methoxy-2-propanol or hexafluoroisopropanol; or water; dimethyl sulfoxide (DMSO); dimethylformamide; acetonitrile; diols such as ethylene glycol or propylene glycol; dimethylacetamide, gamma-butyrolactone, ethyl lactate, or a mixture thereof.

It should also be ensured that the solvent for the prepolymer composition is orthogonal to the block copolymer BCP 20 on which the prepolymer composition is deposited in layer form, so as not to redissolve the block copolymer at the time of the deposition.

In order to obtain a crosslinked top coat TC layer 30 which is neutral with respect to the underlying block copolymer 20, i.e. which does not have any particular affinity for each of the blocks of the block copolymer, the prepolymer composition pre-TC preferably comprises molecules (monomer(s), dimer(s), oligomer(s) or polymer(s)) which have the same epoxy/oxirane chemical functions for ensuring the crosslinking, but different chemical groups so as to be able to modify the overall surface energy of the material and to obtain a crosslinked top coat TC layer that is neutral with respect to the blocks of the underlying block copolymer. An example of this type of material may be obtained, for example, by crosslinking a statistical polymer using three comonomers, such as a poly(glycidyl-co-trifluoroethyl methacrylate-co-hydroxyethyl methacrylate), in which the glycidyl units ensure the intermolecular crosslinking of the chains, and in which the ratio of trifluoroethyl methacrylate (unit having a low surface energy due to the presence of the fluorine atoms) and hydroxyethyl methacrylate (unit having a high surface energy due to the presence of the hydroxyl chemical function, and promoting solubilization of the material in polar protic solvents) makes it possible to modify the desired surface energy.

Preferably, the crosslinking temperature $T_r$ of the layer of prepolymer composition pre-TC is very much lower than the glass transition temperature of the underlying block copolymer BCP 20, which is itself lower than the assembly temperature $T_{ass}$ of the block copolymer BCP allowing it to be nanostructured in nanodomains, for a reaction time from a few seconds to a maximum of a few minutes, preferably less than 15 minutes, more preferably less than 10 minutes and advantageously less than 5 minutes, so as to ensure the highest possible conversion yield for the layer of prepolymer composition into crosslinked polymer layer. Typically, but in a manner that is not limiting for the invention, the crosslinking temperature is preferably between 0° C. and 350° C., more preferably between 10° C. and 300° C. and advantageously between 20° C. and 150° C. Preferably, the highest glass transition temperature of the block copolymer BCP is between 20° C. and 350° C., preferably between 30° C. and 150° C. Preferably, the assembly temperature of the block copolymer BCP is greater than 50° C. and preferably greater than 100° C.

Nevertheless, if the crosslinking temperature $T_r$ of the layer of prepolymer composition pre-TC is above the glass transition temperature Tg of the underlying block copolymer BCP 20, in this case the crosslinking must be "flash" so as to ensure total crosslinking of the layer and the absence of any dewetting. To do this, catalysts or coreagents of polyamine type, ammonium salts, or ascorbic acid and derivatives thereof or phenol and the phenolic derivatives mentioned above make it possible to obtain crosslinking within a few seconds.

Finally, in this case, the crosslinking temperature Tr of the layer of prepolymer composition pre-TC may be either below or above the assembly temperature Tass of the underlying block copolymer BCP. When it is higher than the assembly temperature, taking into account the reversibility of the order/disorder or order/order transitions, assembly annealing subsequent to the crosslinking of the top coat TC layer makes it possible to reassemble the underlying block copolymer BCP which will possibly have been disordered during the crosslinking step.

According to the second embodiment, the prepolymer composition pre-TC comprises one or more multifunctional acrylic monomers, such as cyanoacrylate derivatives. In this case, the presence of a catalyst in the prepolymer composition is not necessary, since the polymerization/crosslinking reaction is spontaneous at room temperature and catalyzed by the ambient moisture. According to this embodiment, the underlying block copolymer needs to be solid at the crosslinking temperature of the layer of prepolymer composition. To do this, the crosslinking temperature $T_r$ of the layer of prepolymer composition must be below the highest glass transition temperature Tg of the block copolymer BCP ($T_r<Tg^{BCP}$) and the block copolymer must have at least one block for which at least 40% of the composition has a glass transition temperature above room temperature, i.e. above 25° C. In this case, the reagent, of cyanoacrylate type, is alone in its phase and in the initial monomer form or in the form of a mixture of monomers each having the same chemical functions ensuring the crosslinking, but each of the monomers bearing different chemical groups (such as different ester groups) so as to ensure modification of the overall surface energy of the material and to obtain a crosslinked top coat TC layer which is neutral with respect to the underlying block copolymer BCP. The crosslinking reaction can then be simply induced by the moisture of the ambient atmosphere, or alternatively water or alcohol may be dispensed on the layer of prepolymer composition so as to accelerate the crosslinking reaction.

In this case, the crosslinking reaction then takes place at a very moderate temperature, typically between 15° C. and 100° C. and preferably less than or equal to 40° C. Furthermore, this crosslinking reaction has the advantage of being rapid, typically from a few tens of seconds to a few minutes and in all cases less than 5 minutes.

In order to further limit a possible dewetting phenomenon of the top coat TC layer 30, the rigidity (measured, for example, by estimating the Young's modulus of the top coat TC once crosslinked or polymerized) and the glass transition temperature of the top coat layer can be reinforced by introducing, in the pre-TC prepolymer composition, rigid co-monomers selected from derivatives having either one or more aromatic ring(s) in their structure, or mono- or multi-cyclic aliphatic structures, and having one or more chemical function(s) adapted to the crosslinking reaction targeted. More particularly, these rigid comonomers are selected from derivatives of norbornene, isobornyl acrylate or methacrylate, styrene, anthracene derivatives, adamantyl acrylate or methacrylate.

However, in the context of directed self-assembly nanolithography applications, it should be ensured that the top coat TC, once formed, does not correspond to a porous or multi-phase network, so as to avoid possible problems of inhomogeneity/demixing of the top coat TC for the underlying block copolymer BCP. To this end, the pre-TC prepolymer composition may comprise plasticizers and/or wetting agents as additives, if need be. In the context of other applications, such as the manufacture of membranes or biocompatible implants, for example, it may instead be advantageous for the top coat TC, once formed, to correspond to such a porous or multi-phase network.

To be able to manufacture a nanolithography mask, for example, once the top coat TC layer has been crosslinked, the stack obtained, having a clear BCP/TC interface and a perfectly flat surface, is subjected to annealing, at an assembly temperature Tass, for a given time, preferably less than 10 minutes and more preferably less than 5 minutes, so as to cause nanostructuring of the block copolymer. The nanodomains 21, 22 which form then orient perpendicular to the neutralized interfaces of the block copolymer BCP.

Next, once the block copolymer has organized, the top coat TC layer can be removed.

One way of removing the crosslinked top coat TC layer consists in using dry etching, such as plasma, for example with a suitable gas chemistry, such as a predominant oxygen base in a mixture with a gas that is rather inert such as He, Ar, $N_2$, for example. Such dry etching is all the more advantageous and easier to perform if the underlying block copolymer BCP 20 contains, for example, silicon in one of its blocks, which then acts as an etch-stopping layer.

Such dry etching may also be interesting in the case where the underlying block copolymer BCP has been deposited with an overthickness E and where not only the top coat TC layer must be removed, but also the overthickness E of block copolymer. In this case, the chemistry of the constituent gases of the plasma will have to be adjusted depending on the materials to be removed so as not to have any particular selectivity for a block of the block copolymer BCP. The top coat TC layer and the overthickness E of the block copolymer BCP can then be removed simultaneously or successively, in a same etching chamber, by plasma etching by adjusting the chemistry of the gases depending on the constituents of each of the layers to be removed.

Similarly, at least one of the blocks 21, 22 of the block copolymer BCP 20 is removed so as to form a porous film that is capable of serving as a nanolithography mask. This removal of the block(s) may also be performed in the same dry etching chamber, following the removal of the top coat TC layer and the optional overthickness E of block copolymer.

It is also possible to select zones of the prepolymer layer that are intended to be crosslinked and other zones that are intended to remain in the form of amorphous prepolymer layer. In this case, the substrate/BCP/pre-TC stack is subjected to high-temperature annealing using a local heat source. This local heat source may be, for example, an infrared laser, or a broad-band infrared spectrum lamp through a lithography mask, for which a set of wavelengths is used rather than a restricted range as in the case of radiation of laser type, or via a mechanical means such as a heating tip of an atomic force microscope, or alternatively a process of "roll-to-roll" type, in which a heated nanostructured roll is placed in contact with the surface of the layer of prepolymer composition by impression. This localized heat treatment of certain zones of the prepolymer layer must allow crosslinking of "flash" type.

In the context of applying the process according to the invention to directed self-assembly nanolithography, the crosslinked zones of top coat have neutral affinity with respect to the underlying block copolymer, whereas the zones of non-crosslinked top coat may have preferential affinity for at least one of the blocks of the underlying block copolymer. It then becomes possible to define zones of interest on the same stack, in which the layer of prepolymer pre-TC can be crosslinked, by thermal crosslinking, and other zones in which the layer of prepolymer pre-TC will remain in amorphous non-crosslinked form. In this case, the patterns of the underlying block copolymer BCP will be perpendicular to the interfaces in zones located facing the zones of the neutral top coat that have been heated and crosslinked, whereas they will, on the other hand, be oriented parallel to the interfaces in the other zones, located facing the non-heated and thus non-crosslinked zones. The patterns oriented parallel to the interfaces then cannot be transferred into the underlying substrate during subsequent etching steps.

To do this, the following method may simply be performed. The layer of pre-TC prepolymer is deposited, and then areas of interest of this layer are locally, for example using an infrared laser. The layer obtained is then rinsed in the solvent which served for its deposition, for example, the solvent itself being orthogonal to the block copolymer. This rinsing makes it possible to remove the zones of prepolymer composition that have not been heated and thus have not crosslinked. Optionally, another prepolymer material, which is not neutral with respect to the underlying block copolymer, may be deposited in the areas which have not been the heat-treated beforehand and which have been rinsed, and which are thus free of top coat layer, and then said non-neutral prepolymer material is subjected to a localized heat treatment, so as to crosslink/polymerize it in the predefined places. The stack is then subjected to annealing at the assembly temperature so that the block copolymer becomes structured. In this case, the nanodomains facing the crosslinked neutral zones of the top coat TC layer are oriented perpendicular to the interfaces, whereas the nanodomains facing zones free of neutral and crosslinked top coat are oriented parallel to the interfaces.

The Followings Examples Illustrate the Scope of the Invention in a Non-Limiting Manner:

Example 1: Block Copolymers Used

The poly(1,1 dimethylsilacyclobutane)-block-polystyrene ("PDMSB-b-PS") block copolymers used were synthesized by sequential anionic polymerization, as already reported in the prior art (K. Aissou &al., *Small*, 2017, 13, 1603777). The block copolymer No. 1 more specifically used here has a number average molar mass (Mn) of 17,000 g/mol, with a polydispersity index of 1.09 measured by steric exclusion chromatography (SEC) with polystyrene standards. The characterization shows a composition of 51% (by mass) PS and 49% (by mass) PDMSB. The block copolymer No. 2 more specifically used here has a number average molar mass (Mn) of 14,000 g/mol, with a polydispersity index of 1.07. The characterization shows a composition of 51% (by mass) PS and 49% PDMSB. The period of the block copolymer No. 1 is measured at ~18 nm, that of No. 2 is measured at ~14 nm, via a fast Fourier transform (FFT) of images taken by scanning electron microscopy (SEM), on self-organized films. As described in the literature cited, the "PDMSB" block contains silicon in its composition.

Example 2: Synthesis of Surface Passivation Layers and Top Coat Layers

The copolymers or homopolymers used in the context of the invention have been synthesized by standard methods such as NMP (nitroxide mediated polymerization, for example with an initiator such as Arkema's initiator marketed under the name BlocBuilder®) or a conventional radical method (with an initiator such as azobisisobutyronitrile), known to the one skilled in the art. The number average molar mass obtained are typically of the order of Mn-5,000-10,000 g/mol. The polymer used as a neutralizing underlayer is a 2-ethylhexyl polymethacrylate homopolymer. The copolymer used as a top coat layer has a copolymer architecture of the poly(glycidyl methacrylate-co-trifluoroethyl methacrylate-co-hydroxyethyl methacrylate) type, subsequently abbreviated to "PGFH", of variable "GFH" compositions, ranging from 25/3/72 to 25/47/28, by mass compositions. In the absence of other specifications explicitly mentioned, the results obtained being equivalent for the different compositions mentioned above, only those concerning the composition 25/37/38 are detailed below.

Example 3: Solvents for Top Coat Copolymers

The various copolymers synthesized according to Example 2 of the PGFH type are all soluble entirely in alcoholic solvents up to 10% by weight or less, such as methanol, ethanol, isopropanol, PGME (propylene glycol methyl ether), or ethyl lactate, as well as in mixtures of these same solvents in any proportions. The block copolymers described in Example No. 1 are not soluble in the same solvents or mixtures thereof.

Solubility parameters for these different solvents are available in the literature (Hansen, Charles (2007). Hansen Solubility Parameters: A user's handbook, Second Edition. Boca Raton, Fl.: CRC Press. ISBN 978-0-8493-7248-3.), but they are grouped in Table 1 below for convenience:

TABLE 1

| Solvent | CAS No. | Hansen parameters at 25° C. ((MPa)$^{1/2}$) | | |
|---|---|---|---|---|
| | | δD | δP | δH |
| methanol | 67-56-1 | 15.1 | 12.3 | 22.3 |
| ethanol | 64-17-5 | 15.8 | 8.8 | 19.4 |
| PGME | 107-98-2 | 15.6 | 6.3 | 11.6 |
| isopropanol | 67-63-0 | 15.8 | 6.1 | 16.4 |
| ethyl lactate | 687-47-8 | 16 | 7.6 | 12.5 |

When these solvents are used to solubilize PGFH copolymers with their additives, spin-coated deposits on block copolymers (PDMSB-b-PS) No. 1 or No. 2 show excellent uniformity.

Example 4: Example of the Thermal Crosslinking Kinetics of the Top Coat

A 2 wt. % PGFH copolymer solution is made in absolute ethanol as well as 2 wt. % solution of ammonium triflate (ammonium trifluoromethane sulfonate, "ATMS") also in absolute ethanol is prepared. A mixed solution of PGFH and ATMS is then prepared at 90 wt. % PGFH and 10 wt. % ATMS. The solution thus obtained is dispensed by spin-coating at 2,000 revolutions per minute (rpm) on a silicon substrate (crystallographic orientation [100], with a native oxide layer of ~2 nm). A ~68 nm thick, homogeneous film is obtained. The substrate is then annealed at variable temperature for two minutes, then the substrate is rinsed in an ethanol bath in order to remove the molecules which have not reacted during the heat treatment, then the film is dried under a stream of nitrogen, and the thickness of the film is sought by ellipsometry. The results obtained for different annealing temperatures are reported in Table 2 below and illustrated in the corresponding graph in FIG. 4. Note that for reference, a deposited film emits a 1.8% PGFH solution in the pure ethanol (therefore without ATMS) has a maximum thickness of ~2 nm after rinsing; similarly, a film of the mixture solution not annealed and not rinsed after deposition has a maximum thickness of ~68 nm

TABLE 2 residual thickness measured according to different annealing temperatures

| Sample no | temperature (° C.) | thickness (nm) |
|---|---|---|
| 1 | 80 | 33.15 |
| 2 | 100 | 64.7 |
| 3 | 120 | 68 |
| 4 | 140 | 67.4 |
| 5 | 160 | 66.4 |

According to this example, it can be seen that almost all of the film is kept from 100° C. for 2 minutes of reaction. Note that if an acceleration of this reaction is wanted (at constant residual thickness and constant temperature, obtain a reaction of less than 2 minutes), it is possible to increase the proportion of ATMS compared to that of PGFH.

It is noted that the same type of results can be obtained by replacing ATMS with a compound such as pyridinium para-toluenesulfonate with a ratio (8:2) PGFH/catalyst.

Example 5: Self-Organization of Block Copolymer According to the Invention-Crosslinked Neutral Top Coat The following standard procedure is carried out for all the block copolymer samples subsequently characterized by scanning electron microscopy.

Homopolymers used as an underlayer are dissolved in a good solvent, such as 2 wt. % propylene glycol monomethyl ether acetate (PGMEA). The block copolymer is dissolved in a good solvent such as 0.75 wt. % methyl isobutyl ketone (MIBK). The top coat copolymer is dissolved in 1.8 wt. % absolute ethanol to which 0.18% ammonium triflate is added. Each solution is filtered on PTFE (polytetrafluoroethylene) filters with a porosity of 200 nm to remove potential particles and dust. The silicon substrates are cut into 3 cm×3 cm samples from 200 mm wafers of silicon with a [100] crystallographic orientation, and then used as is.

The underlayer solution is dispensed by spin-coating onto the silicon substrate at a speed of 700 revolutions per minute (rpm), to obtain a ~70 nm thick film. The substrate is then annealed at 200° C. for 75 seconds in order to graft the molecules onto said substrate, and then the excess not grafted material is simply rinsed off in a solvent bath (PGMEA), and the residual solvent is blown off under a nitrogen flow. The block copolymer solution is subsequently dispensed by spin-coating at 2,000 revolutions per minute (rpm) to obtain a ~25 nm thick, homogeneous film. Optionally, annealing on a hot plate at 90° C. for 30 seconds is carried out so as to evaporate the residual solvent. The solution of top coat is then dispensed onto the block copolymer layer by spin-coating at 2,000 revolutions per minute (rpm) to obtain a ~60 nm thick top-coat. The substrate is then subjected to a post-exposure bake at 90° C. for 3 minutes in order to promote crosslinking of the top-coat. The block copolymer is then self-organized at 220° C. for 5 minutes. The sample is then bonded to a silicon wafer in order to undergo a subsequent etching step, as detailed in the corresponding example 6. The different samples are then analyzed by scanning electron microscopy (SEM) on a CD-SEM H9300 from Hitachi or MEB 5000 Hitachi. The results obtained are reported in FIG. 5 which represent the SEM images of the samples of block copolymer no 1 for different PGFH top-coat compositions used, whose self-organization is perpendicular to the substrate and whose period is I 18 nm. It is noted that the same type of results (film of copolymer with lamellar block PDMSB-b-PS whose patterns are oriented entirely perpendicular to the substrate) is observed for smaller thicknesses (from 0.5 to 1 times the period of the block copolymer used), or greater than that reported (more than 4 times the period of the block copolymer).

According to this example, it can be seen that the domains of the lamellar PDMSB-b-PS block copolymer are well oriented perpendicularly to the substrate for the various studied top-coat compositions. On the other hand, when a copolymer not comprising trifluoroethyl methacrylate is used as a top coat under the same conditions, that is to say for example a copolymer of composition "GFH" 25/0/75, a mixed orientation parallel/perpendicular or fully parallel patterns is obtained. Finally, as described in Example 7 below, under these process conditions (in particular self-organizing annealing), no dewetting is observed on the films corresponding to FIG. 5.

Example 6: Plasma Etching/Removal of the Top Coat Layer

The top coat film removal/dry etching experiments were conducted in an inductively coupled plasma DPS reactor, from Applied Materials, the wall of which are made of aluminum oxide. The samples are physically bonded to a 200 mm diameter silicon wafer before being introduced into the reactor chamber. The plasma is inductively excited via two 13.56 MHz radio frequency antennas with up to 3 kW power supply to improve the uniformity of the ion flow.

Plasma with a chemistry and conditions such as $CF_4$ (50 sccm), $O_2$ (70 sccm), 10 mT, 100 $W_{source}$, 10 $W_{bias}$, is carried out on PGFH copolymer films of an initial thickness of ~130 nm with variable plasma times. The PGFH films are prepared as described in Example 4. The concentration of the constituents is adjusted here to 4 wt. % in order to obtain slightly thicker films than in Example 4 and thus have a better accuracy on the etching speed of the PGFH film; the rest of the method is unchanged. Once the plasma has been applied, the residual film thicknesses are measured by ellipsometry. The results are shown in Table 3 below and illustrated in the graph in FIG. 6.

TABLE 3 residual thickness measured for a PGFH film having undergone different plasma times.

| Duration (sec) | Residual thickness (nm) |
| --- | --- |
| 7 | 95 |
| 10 | 79 |
| 13 | 64 |
| 16 | 52 |
| 20 | 32 |

According to this example, the PGFH copolymer is then etched at a speed of ~4.8 nm·s$^{-1}$ under these plasma conditions.

According to the samples prepared as in Example 5, as well as the data shown above, the top coat with an initial thickness of ~60 nm is therefore removed entirely with a plasma time of 13 seconds. Thereafter, optionally, a plasma with mild chemistry and conditions of Ar (80 sccm), $O_2$ (40 sccm), 10 mT, 200 $W_{source}$, 20 $W_{bias}$, carried out for 10 seconds, allows partial removal of the phase corresponding to the PS of the block copolymer in order to improve the contrast in SEM imaging.

It should be noted that in this example, the plasma chemistries and conditions under which the PGFH film can be removed are very arbitrary, and therefore other equivalent conditions easily established by the one skilled in the art would equally well achieve the same result.

Example 7: Effect of Crosslinking on the Possible Dewettings of the Block Copolymer/Top Coat Stack Homopolymers used as an underlayer are dissolved in a good solvent, such as 2 wt. % propylene glycol monomethyl ether acetate (PGMEA). The block copolymer is dissolved in a good solvent such as 0.75 wt. % methyl isobutyl ketone (MIBK). The PGFH top coat copolymer is dissolved in 1.8 wt. % absolute ethanol to which 0.18% ammonium triflate is added. Each solution is filtered on PTFE filters with a porosity of 200 nm to remove potential particles and dust. The silicon substrates are cut into 3 cm×3 cm samples from 200 mm wafers of silicon with a [100] crystallographic orientation, and then used as is.

The following procedure is carried out for samples corresponding to a given and predetermined experimental set:
Solid/liquid" dewetting: (dewetting of the block copolymer on its neutral underlayer): reference No. 1

The neutral underlayer solution is dispensed by spin-coating onto the silicon substrate at a speed of 700 revolutions per minute (rpm), to obtain a ~70 nm thick film. The substrate is then annealed at 200° C. for 75 seconds in order to graft the molecules onto said substrate, and then the excess not grafted material is simply rinsed off in a solvent bath (PGMEA), and the residual solvent is blown off under a nitrogen flow. The block copolymer solution is subsequently dispensed by spin-coating at 2,000 revolutions per minute (rpm) to obtain a ~25 nm thick, homogeneous film. The substrate is then annealed on a hot plate at variable temperature from 90° C. to 230° C. for 5 minutes, in 20° C. steps (only one sample is made for each of these temperatures). The sample is then subjected to a plasma of mild chemistry and conditions such as Ar (80 sccm), $O_2$ (40 sccm), 10 mT, 100 $W_{source}$, 10 $W_{bias}$, for 15 seconds in order to "freeze" the resulting structure and thus prevent polymer creep over time while improving SEM imaging conditions. Each resulting sample is then characterized by scanning electron microscopy (SEM), by performing a statistic of ~10 images at a typical magnification of ×5,000 or ×10,000 to determine the level of film dewetting.

"Solid/liquid/liquid" dewetting: (dewetting of the block copolymer+top coat system, when the top coat is not crosslinked): reference No. 2

The PGFH top coat copolymer is first dissolved in 2 wt. % absolute ethanol, and then the resulting solution is filtered after the dissolution, and will be used as is afterwards. The neutral underlayer solution is dispensed by spin-coating onto the silicon substrate at a speed of 700 revolutions per minute (rpm), to obtain a ~70 nm thick film. The substrate is then annealed at 200° C. for 75 seconds in order to graft the molecules onto said substrate, and then the excess not grafted material is simply rinsed off in a solvent bath (PGMEA), and the residual solvent is blown off under a nitrogen flow. The block copolymer solution is then dispensed by spin-coating at 2,000 revolutions per minute (rpm) to obtain a ~25 nm thick, homogeneous film. The top coat copolymer in ethanol is then dispensed onto the block copolymer film by spin-coating at 2,000 revolutions per minute (rpm) to obtain a ~65 nm thick film. The substrate is then annealed on a hot plate at 50° C. to 210° C. for 5 minutes, in 20° C. steps (only one sample is made for each of these temperatures). The samples are then subjected to a plasma of mild chemistry and conditions such as Ar (80 sccm), $O_2$ (40 sccm), 10 mT, 100 $W_{source}$, 10 $W_{bias}$, for 15 seconds in order to "freeze" the resulting structure and thus prevent polymer creep over time while improving SEM imaging conditions. Each resulting sample is then characterized by scanning electron microscopy (SEM), by performing a statistic of ~10 images at a typical magnification of ×5,000 or ×10,000 to determine the level of film dewetting.

"Solid/liquid/solid" dewetting: (dewetting of the block copolymer+top coat system, when the top coat is crosslinked): approach proposed by the invention The neutral underlayer solution is dispensed by spin-coating onto the silicon substrate at a speed of 700 revolutions per minute (rpm), to obtain a ~70 nm thick film. The substrate is then annealed at 200° C. for 75 seconds in order to graft the molecules onto said substrate, and then the excess not grafted material is simply rinsed off in a solvent bath (PGMEA), and the residual solvent is blown off under a nitrogen flow. The block copolymer solution is then dispensed by spin-coating at 2,000 revolutions per minute (rpm) to obtain a ~25 nm thick, homogeneous film. The top coat copolymer, in a 90/10 blend with the ATMS, in ethanol is then dispensed onto the block copolymer film by spin-coating at 2,000 revolutions per minute (rpm) so as to obtain a ~65 nm thick film. The substrate is then annealed a first time at 90° C. for 3 minutes on a heating plate to promote the cross-linking reaction of the top coat, then a second annealing is carried out at variable temperature, from 90° C. to 230° C. for 5 minutes, in 20° C. steps (only one sample is made for each of these temperatures). The samples are then subjected to a plasma of mild chemistry and conditions such as Ar (80 sccm), $O_2$ (40 sccm), 10 mT, 100 $W_{source}$, 10 $W_{bias}$, for 15 seconds to "freeze" the resulting structure of the block copolymer and thus prevent polymer creep over time while improving SEM imaging conditions. Each resulting sample is then characterized by scanning electron microscopy (SEM), by performing a statistic of ~10 images at a typical magnification of ×5,000 or ×10,000 to determine the level of film dewetting.

For each sample set, the images are processed identically with the imageJ software developed by the National Institutes of Health (http://imagej.nih.gov), although other image processing software can also be used to achieve the same result, in order to determine the area corresponding to the dewetted areas of the film and thus extract a percentage of film coverage on the substrate for each annealing temperature considered. Image processing is relatively simple, and done one by one, manually if failing to have appropriate software. This treatment includes the following stages:

1) the images are first calibrated in scale (optional, because it could measure a percentage of pixels because here they measure 512×512 pixels), 2) adjustment of contrast & gray level if necessary, 3) image thresholding [the zones corresponding to dewetting appear lighter than those where the polymer(s) cover the substrate, the correct thresholding makes it possible to delimit each zone precisely]. If a thresholding is not possible due to a lack of contrast making the delimitation of the zones imprecise, these are first artificially colored in black, then the image is thresholded, 4) extraction of the contours of the objects, estimation of the area occupied by the dewetted patterns versus the total area of the image and conversion into percentage of coverage of the film.

The complete treatment is summarized in FIG. 7 which represents the main steps of the image processing to extract the areas of interest: a) raw CDSEM image (512×512 pixels, 13495 nm×13495 nm); b) contrasting image; c) thresholded image (the white areas correspond to the areas with dewetting); d) extraction of the outline and the corresponding area of each white area of the image c).

The data obtained for each series of samples are grouped and then plotted as a function of the annealing temperature applied, such as on the graph in FIG. 8 which represents the impact of the crosslinking of the top coat layer on the different possible dewetting of the system.

According to this example, it is obvious that if the top coat is not crosslinked (reference No. 2), it induces a deformation of the block copolymer layer quickly leading to complete dewetting of the block copolymer on the neutralized surface. The block copolymer itself (reference no 1) tends to dewet on the corresponding neutralization layer from 150° C. when no top coat is present. However, even if it is more stable with respect to dewetting than reference No. 2, this film has no chance of producing patterns oriented perpendicular to the substrate. Finally, it can be seen that neither the block copolymer film nor the top-coat film have dewetted when the top-coat has undergone a crosslinking step before being subjected to high temperature ("solid/liquid/solid dewetting"). It is therefore undeniable that the crosslinked top coat makes it possible to control, or even eliminate, the possible dewetting phenomena of the stack. Furthermore, it can be noted that this latter configuration makes it possible to obtain patterns oriented perpendicularly, as described in Example 5.

Example 8: Planarity of Interfaces

Homopolymers used as an underlayer are dissolved in a good solvent, such as 2 wt. % propylene glycol monomethyl ether acetate (PGMEA). The block copolymer No. 2 is dissolved in a good solvent such as 1.5 wt. % methyl isobutyl ketone (MIBK). The top coat copolymer PGFH is dissolved in 1.8 wt. % absolute ethanol to which 0.18% ammonium triflate is added. Each solution is filtered on PTFE filters with a porosity of 200 nm to remove potential particles and dust. The silicon substrates are cut into 3 cm×3 cm samples from 200 mm wafers of silicon with a [100] crystallographic orientation, and then used as is.

The underlayer solution is dispensed by spin-coating onto the silicon substrate at a speed of 700 revolutions per minute (rpm), to obtain a ~70 nm thick film. The substrate is then annealed at 200° C. for 75 seconds in order to graft the molecules onto said substrate, and then the excess not grafted material is simply rinsed off in a solvent bath (PGMEA), and the residual solvent is blown off under a nitrogen flow. The block copolymer solution is subsequently dispensed by spin-coating at 2,000 revolutions per minute (rpm) to obtain a ~50 nm thick, homogeneous film. Optionally, annealing on a hot plate at 90° C. for 30 seconds is carried out so as to evaporate the residual solvent. The solution of top coat is then dispensed onto the block copolymer layer by spin-coating at 2,000 revolutions per minute (rpm) to obtain a ~60 nm thick top-coat. The substrate is then subjected to a post-exposure bake at 90° C. for 3 minutes in order to promote crosslinking of the top-coat. The block copolymer is then self-organized at 160° C. for 5 minutes.

For the analysis of the sectioned sample via FIB-STEM (fast ion bombardment—scanning transmission electronic microscope) preparation, the following procedure is used: the preparation of the thin slide of the sample as well as its STEM analysis are carried out on a Helios 450S instrument. A 100 nm platinum layer is first deposited on the sample by evaporation to prevent polymer damage. An additional 1 μm layer is deposited on the sample in the STEM enclosure by a high-energy ion beam. After careful alignment perpendicularly to the sample (sectional view), a thin slide thereof is extracted via FIB, and then gradually refined until a width of approximately 100 nm is obtained. An in-situ observation is then carried out using the STEM detector. The result of the analysis is shown in FIG. 9 which represents the assembly of the lamellar block copolymer (BCP) No. 2("lam BCP" in the FIG. 9), as seen in cross section by FIB-STEM preparation. Microscopy indicates that the lamellae are perpendicular to the substrate over the entire thickness of the film (in grey/black: PDMSB lamellae; in grey/white: PS lamellae).

To control the perpendicularity of the block copolymer patterns on the sample, the process for removing the top coat and preparing for CDSEM imaging is identical to that described in Example 5. The result is shown in FIG. 10 which represents a CDSEM image in top view showing the perpendicular assembly of the block copolymer no 2, of period ~14 nm.

The FIG. 9 shows that the crosslinking of the top coat material makes it possible to maintain a particularly clear interface between the top coat material and the block copolymer, as described in the context of the invention (no mixing observable between the two materials), as well as a very flat film for the two materials. Incidentally, FIG. 9 also demonstrates that the invention is particularly effective both for generating patterns (lamellae) perfectly oriented in the same direction throughout the thickness of the block copolymer film, as well as for generating copolymer patterns with blocks having a strong form factor (lamellae of ~7 nm wide by ~45 nm thick, therefore a form factor of ~6.4).

The invention claimed is:

1. A method for manufacturing a flat polymeric stack, comprising depositing on a substrate a first layer of non-crosslinked (co)polymer, and then a second layer of (co)polymer, at least one of the first and second layers initially being in a liquid or viscous state, wherein, at the time of the deposition of the second layer on the first layer, the second layer is in the form of a prepolymer composition (pre-TC) comprising one or more monomer(s) and/or dimer(s) and/or oligomer(s) and/or polymer(s) in solution, and wherein an additional step comprises submitting said second layer to a localized heat treatment capable of causing a crosslinking reaction of the one or more monomer(s) and/or dimer(s) and/or oligomer(s) and/or polymer(s) within selected locations of said second layer and allowing the production of a layer having selectively crosslinked top coat (TC) areas.

2. The method according to claim 1, wherein the heat treatment comprises heating the stack in a temperature range between 20 and 150° C., for a time less than 15 minutes.

3. The method according to claim 1, wherein the prepolymer composition (pre-TC) is a composition formulated in a solvent, or used without solvent, and which comprises at least one monomer, dimer, oligomer or polymer chemical species, or any mixture of these various species, of totally or partly identical chemical nature, and each including at least one chemical function capable of ensuring the crosslinking reaction under the effect of a heat stimulus.

4. The method according to claim 1, wherein the prepolymer composition (pre-TC) also comprises a heat-activatable catalyst, chosen from radical generators, or acid generators, or base generators.

5. The method according to claim 1, wherein at least one chemical species of the prepolymer composition contains at least one fluorine and/or silicon and/or germanium atom, and/or an aliphatic carbon-based chain of at least two carbon atoms in its chemical formula.

6. The method according to claim 1, wherein when the crosslinking is performed via a radical route, the prepolymer composition (pre-TC) also comprises a heat-activatable catalyst, chosen from derivatives of organic peroxide type, or alternatively derivatives including a chemical function of azo type, or alternatively derivatives of alkyl halide type.

7. The method according to claim 1, wherein the prepolymer composition comprises a mixture of monomer(s) and/or dimer(s) and/or oligomers(s) and/or polymer(s), comprising epoxy/oxirane functions, and a catalyst for generating an acid and/or a coreagent for performing an addition reaction on the epoxy functions.

8. The method according to claim 1, wherein the prepolymer composition comprises a mixture of one or more multifunctional acrylic monomer(s), of cyanoacrylate type, which are capable of spontaneously giving rise to a crosslinking reaction at ambient or moderate temperature, in the presence of ambient moisture.

9. The method according to claim 1, wherein a crosslinking temperature of the second layer of prepolymer composition (pre-TC) is below the glass transition temperature Tg of the first layer and wherein the highest glass transition temperature Tg of the first layer is greater than 25° C.

10. The method according to claim 1, wherein the prepolymer composition (pre-TC) also comprises a solvent chosen from solvents or solvent mixtures whose Hansen solubility parameters are such that $\delta_p \geq 10$ MPa$^{1/2}$ and/or $\delta_h \geq 10$ MPa$^{1/2}$, and with $\delta_d < 25$ Mpa$^{1/2}$.

11. The method according to claim 1, wherein the first layer is a block copolymer (BCP) capable of nanostructuring at an assembly temperature, and wherein prior to the step of depositing the first layer of block copolymer, the method comprises a step of neutralizing a surface of the underlying substrate and wherein, after the step of crosslinking the second layer to form a crosslinked top coat layer, the method comprises a step of nanostructuring the block copolymer constituting the first layer by subjecting the stack obtained to an assembly temperature, said assembly temperature being lower than a temperature at which the top coat (TC) material behaves like a viscoelastic fluid, said temperature being higher than the glass transition temperature of said top coat material and said assembly temperature being lower than the glass transition temperature of the top coat in its crosslinked form.

12. The method according to claim 11, wherein the step of neutralizing the surface of the underlying substrate comprises predrawing patterns on the surface of the substrate, said patterns being predrawn by a lithography step or a sequence of lithography steps of any nature prior to the step of depositing the first layer of block copolymer (BCP), said patterns being intended to guide the organization of said block copolymer (BCP) by a technique known as chemical epitaxy or graphoepitaxy, or a combination of these two techniques, in order to obtain a neutralized or pseudo-neutralized surface.

13. The method according to claim 11, wherein the block copolymer comprises silicon in one of its blocks.

14. The method according to claim 11, wherein when the prepolymer composition comprises a mixture of one or more multifunctional acrylic monomer(s), of cyanoacrylate type, the crosslinking temperature of the second layer of prepolymer composition (pre-TC) is below the highest glass transition temperature Tg of the first layer of block copolymer (BCP) and the block copolymer has at least one block for which at least 40% of the composition has a glass transition temperature of greater than 25° C.

15. The method according to claim 11, wherein the first layer of block copolymer (BCP) is deposited on a thickness at least equal to 1.5 times the minimum thickness of the block copolymer.

16. A method for manufacturing a nanolithography mask by directed assembly of block copolymers, said method comprising the steps according to claim 11, wherein after the step of nanostructuring the block copolymer constituting the first layer, an additional step comprising removing the top coat (TC) in order to leave a film of nanostructured block copolymer of a minimum thickness, and then at least one of the blocks of said block copolymer, oriented perpendicular to the interfaces, is removed in order to form a porous film suitable for use as a nanolithography mask.

17. The method for manufacturing a nanolithography mask according to claim 16, wherein when the block copolymer is deposited to a thickness greater than the minimum thickness, an overthickness of said block copolymer is removed simultaneously with or successively to the removal of the top coat (TC), so as to leave a film of nanostructured block copolymer of a minimum thickness, and then at least one of the blocks of said block copolymer, oriented perpendicular to the interfaces, is removed so as to form a porous film that is capable of serving as a nanolithography mask.

18. The method for manufacturing a nanolithography mask according to claim 16, wherein the localized heat treatment creates the selectively crosslinked top coat (TC) areas having a neutral affinity with respect to the underlying block copolymer and non-crosslinked (pre-TC) areas having a non-neutral affinity with respect to the underlying block copolymer.

19. The method for manufacturing a nanolithography mask according to claim 16, wherein another prepolymer material, which is not neutral with respect to the underlying block copolymer, is deposited in areas which have not been heat-treated beforehand and which are free of the top coat layer, then said non-neutral prepolymer material is subjected to a localized heat treatment so as to crosslink/polymerize the non-neutral prepolymer deposited in the areas which have not been heat-treated beforehand and which are free of the top coat layer, and then annealing the stack at an assembly temperature of the block copolymer to form nanodomains perpendicular to the interfaces in areas facing the areas of the neutral crosslinked top coat (TC) layer, and nanodomains parallel to the interfaces in areas of the block copolymer facing the areas free of crosslinked neutral top coat layer.

20. A polymeric stack comprising at least two polymer layers stacked one on the other, wherein a top coat (TC) is deposited on a first polymer layer by in situ crosslinking according to the method of claim 1, said stack being intended to be used in applications selected from the production of coatings for the aerospace or aeronautical or motor vehicle or wind turbine sectors, inks, paints, membranes, biocompatible implants, packaging materials, or optical components, such as optical filters, or microelectronic or optoelectronic or microfluidic components.

21. The method according to claim 6, wherein the derivative including a chemical function of azo type is azobisisobutyronitrile.

22. The method according to claim 1, wherein the localized heat treatment is performed using an infrared laser, broad-band light irradiation, a heated tip of an atomic force microscope, or a roll-to-roll type process.

* * * * *

UNITED STATES PATENT AND TRADEMARK OFFICE
CERTIFICATE OF CORRECTION

PATENT NO. : 11,454,880 B2
APPLICATION NO. : 16/766491
DATED : September 27, 2022
INVENTOR(S) : Xavier Chevalier It is certified that error appears in the above-identified patent and that said Letters Patent is hereby corrected as shown below:

In the Specification

Column 14, Line 14: please remove "FIGS. 1A to 10," and insert --FIGS. 1A to 1C,--

Column 16, Line 63: please remove "FIG. 10, the invention" and insert --FIG. 1C, the invention--

Column 20, Line 43: please remove "such that $MPa^{1/2}$." and insert --such that $\delta_p \leq 9\ MPa^{1/2}$.--

Column 24, Line 8: please remove "where A, B, C, Z are blocks" and insert --where A, B, C, D,...Z are blocks--

Column 34, Line 25: please remove "20 $W_{has}$, carried out" and insert --20 $W_{bias}$, carried out--

Signed and Sealed this
Thirtieth Day of May, 2023

Katherine Kelly Vidal
*Director of the United States Patent and Trademark Office*